(12) United States Patent
Sasago et al.

(10) Patent No.: US 8,592,789 B2
(45) Date of Patent: Nov. 26, 2013

(54) NONVOLATILE SEMICONDUCTOR MEMORY DEVICE AND MANUFACTURING METHOD THEREOF

(75) Inventors: Yoshitaka Sasago, Tachikawa (JP);
Masaharu Kinoshita, Kokubunji (JP);
Mitsuharu Tai, Kokubunkji (JP);
Takashi Kobayashi, Higashimurayama (JP)

(73) Assignee: Hitachi, Ltd., Tokyo (JP)

( * ) Notice: Subject to any disclaimer, the term of this patent is extended or adjusted under 35 U.S.C. 154(b) by 302 days.

(21) Appl. No.: 13/109,985

(22) Filed: May 17, 2011

(65) Prior Publication Data
US 2011/0284817 A1  Nov. 24, 2011

(30) Foreign Application Priority Data
May 18, 2010  (JP) .................................. 2010-114372

(51) Int. Cl.
*H01L 45/00*  (2006.01)

(52) U.S. Cl.
USPC ............................. 257/2; 257/3; 257/4; 257/5

(58) Field of Classification Search
USPC .......................................... 257/2–5, E45.002
See application file for complete search history.

(56) References Cited

U.S. PATENT DOCUMENTS

| | | | |
|---|---|---|---|
| 5,739,545 A | 4/1998 | Guha et al. | |
| 2003/0207544 A1 | 11/2003 | Shimamoto et al. | |
| 2009/0189137 A1 | 7/2009 | Kinoshita et al. | |
| 2009/0230393 A1 | 9/2009 | Miyoshi et al. | |
| 2009/0294751 A1* | 12/2009 | Kiyotoshi | 257/4 |

FOREIGN PATENT DOCUMENTS

| | | |
|---|---|---|
| JP | 05-082825 A | 4/1993 |
| JP | 6-260303 A | 9/1994 |
| JP | 10-223377 A | 8/1998 |
| JP | 2009-181971 A | 8/2009 |
| JP | 2009-218496 A | 9/2009 |

* cited by examiner

*Primary Examiner* — Tran Tran
(74) *Attorney, Agent, or Firm* — Miles & Stockbridge P.C.

(57) ABSTRACT

In a nonvolatile semiconductor memory device, there is provided a technique which promotes microfabrication by reducing a thickness of the device as suppressing an OFF current of a polysilicon diode which is a selective element. A polysilicon layer to which an impurity is doped at low concentration and which becomes an electric-field relaxation layer of the polysilicon diode which is a selective element of a resistance variable memory is formed so as to be divided into two or more layers such as polysilicon layers. In this manner, it is suppressed to form the crystal grain boundaries thoroughly penetrating between an n-type polysilicon layer and a p-type polysilicon layer in the electric-field relaxation layer, and therefore, it is prevented to generate a leakage current flowing through the crystal grain boundaries in application of a reverse-bias voltage without increasing a height of the polysilicon diode.

5 Claims, 31 Drawing Sheets

RESET/SET/READING OPERATION

RESET/SET/READING OPERATION

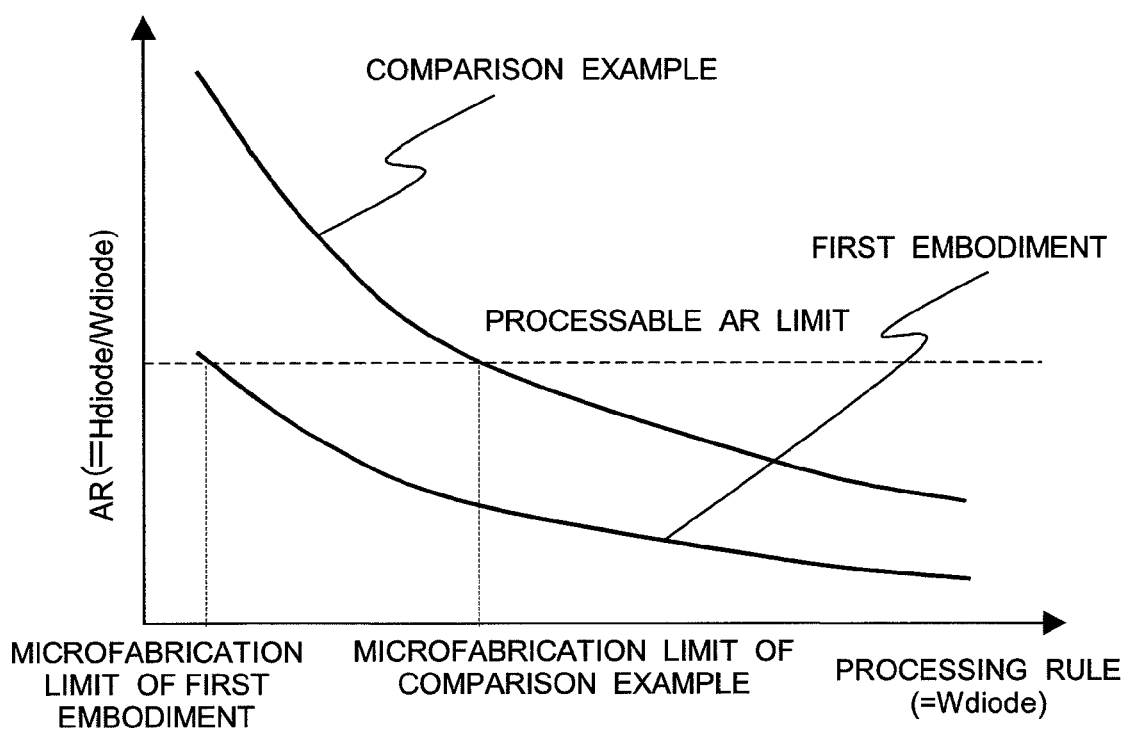

RESET/SET/READING OPERATION

NONVOLATILE SEMICONDUCTOR MEMORY DEVICE AND MANUFACTURING METHOD THEREOF

CROSS-REFERENCE TO RELATED APPLICATION

The present application claims priority from Japanese Patent Application No. 2010-114372 filed on May 18, 2010, the content of which is hereby incorporated by reference into this application.

TECHNICAL FIELD OF THE INVENTION

The present invention relates to a nonvolatile semiconductor memory device and a manufacturing method thereof. More particularly, the present invention relates to a technique effectively applied to a phase-change memory which is electrically rewritable and manufacturing thereof.

BACKGROUND OF THE INVENTION

In recent years, a phase-change memory (Phase-change Random Access Memory: PRAM) using a phase-change material such as chalcogenide has been proposed as a next-generation nonvolatile semiconductor memory. It is expected that, in the phase-change memory, writing/reading operations are performed as fast as those of a DRAM (Dynamic Random Access Memory) in spite of the nonvolatile, and a cell area can be reduced as small as that of a flash memory, and therefore, the phase-change memory has been expected as a next-generation nonvolatile memory.

The phase-change material used for the phase-change memory has already been used for an optical disk medium such as a DVD (Digital Versatile Disc). However, in the case of the DVD, a characteristic that the phase-change material has a different light reflectivity in an amorphous state and a crystalline state is used.

On the other hand, in the case of the phase-change memory, a characteristic that the phase-change material has a different electrical resistance in the amorphous state and the crystalline state by several digits is used, and the phase-change memory is a memory element in which the rewriting is electrically performed by carrying a current through a phase-change material film sandwiched by metal electrodes. A basic memory cell of the phase-change memory has a combined structure of a memory element (phase-change material film) and a selective element. In the phase-change memory, by applying the current from the selective element, the Joule heat is generated in the memory element, and a state of the memory element is changed to the crystalline state or the amorphous state, so that the information is memorized/stored. For the switching of the phase-change memory, that is the phase change of the phase-change material from the amorphous state to the crystalline state and the reverse change thereof, the Joule heat generated when a pulse voltage is applied to the phase-change material film is used. In other words, in the phase change (set operation/writing operation) from the amorphous state to the crystalline state which has a low resistance, a voltage causing a temperature which is equal to or higher than a crystallization temperature of the phase-change material and equal to or lower than a melting point thereof is applied for a relatively long period of time. On the other hand, in the phase change (reset operation/erasing operation) from the crystalline state to the amorphous state which has a high resistance, a short-pulse voltage causing a temperature which is equal to or higher than the melting point of the phase-change material is applied, and then, the current thereof is rapidly reduced to rapidly cool the phase-change material.

Generally, the resistivity of the memory element is changed by two to three digits by the phase changes. Therefore, in the phase change memory, a reading signal is largely varied depending on either the state is crystalline or amorphous, and therefore, the sense operation is easy. As microfabricating the phase-change memory, the current required for changing the state of the phase-change material is reduced, and therefore, the phase-change memory is suitable for the microfabrication in principle and has been actively studied.

As the selective element which selects a written, read, or erased phase-change memory among a plurality of phase-change memories, there is a polysilicon diode having a stacked structure of two or more polysilicon layers including a p-type semiconductor layer (hereinafter, simply referred to as "p-type layer") and an n-type semiconductor layer (hereinafter, simply referred to as "n-type layer"). As a structure of the polysilicon diode which is the selective element of the phase-change memory, a column-shaped structure on a semiconductor substrate is known. In this case, compared to a case in which a transistor is formed on a main surface of the semiconductor substrate as the selective element, an integration degree of the phase-change memory can be improved. As the polysilicon diode which is the selective element, usage of a PN diode in which only the p-type layer and the n-type layer are stacked, a PIN diode in which an I layer (Intrinsic layer: intrinsic semiconductor layer, non-doped polysilicon layer) is formed between the p-type layer and the n-type layer, or others is considered.

Patent Document 1 (Japanese Patent Application Laid-Open Publication No. H06-260303) discloses a technique in which a resistive element is formed of a polysilicon film having a stacked structure in order to improve the temperature dependency of the resistivity of the resistive element formed on the main surface of the semiconductor substrate. The document describes to improve the temperature characteristic by applying the technique for improving the temperature dependency of the resistivity to a diode. However, the document does not describe to use a stacked polysilicon film in order to prevent generation of a leakage current in a reverse direction (reverse bias).

Patent Document 2 (Japanese Patent Application Laid-Open Publication No. H10-223377) discloses a technique in a stacked structure formed of a metal film and an organic layer configuring a light-emitting diode, the technique which prevents the organic layer formed in contact with the metal film from being damaged. The document describes that a resistance of polycrystalline ZnSe in a direction crossing a grain boundary is significantly higher than that in a direction along the grain boundary.

Patent Document 3 (Japanese Patent Application Laid-Open Publication No. H05-082825) discloses a technique which improves the dark current characteristic, optical sensitivity, and afterimage characteristic of a PIN-type or NIP-type photodiode. The document describes that a p-type layer formed of a polysilicon film is formed between another p-type layer and an I layer (Intrinsic layer: intrinsic semiconductor layer, non-doped polysilicon layer) made of polysilicon, and an n-type layer formed of a polysilicon film is formed between another n-type layer and the I layer, so that they configure a PIN-type photodiode. The document describes that, in this manner, the dark current can be suppressed by using the polysilicon film instead of the amorphous silicon film. Note that the document does not describe and teach to avoid the connection of the grain boundaries in the polysilicon film stacked between electrodes.

Patent Document 4 (Japanese Patent Application Laid-Open Publication No. 2009-218496) describes a PN junction diode in which the switching time is speeded up. The document describes that, by forming a p-type polysilicon film on an n⁻-type semiconductor layer which is a monocrystalline silicon layer, a concentration of holes injected from the p-type polysilicon film to the n⁻-type semiconductor layer in the application of a forward voltage can be suppressed because of the p-type polysilicon film having many crystal grain boundaries and small electron mobility.

Patent Document 5 (Japanese Patent Application Laid-Open Publication No. 2009-181971) discloses a technique which controls crystal grain boundaries of a diode by crystallizing a polysilicon film forming a diode of a phase-change memory by laser annealing. The document describes not to form the crystal grain boundaries in a diode formation region or describes to suppress variations in an off-leakage characteristic by orienting the crystal grain boundaries along an inter-electrode direction. However, the document does not describe to prevent the connection of the grain boundaries due to the orientation of the crystal grain boundaries.

SUMMARY OF THE INVENTION

The grain boundary which is an interface between the polysilicon crystal grains forming the I layer (non-doped polysilicon layer or polysilicon layer to which an impurity is doped at a low concentration) formed of a single layer has a property that electrons can easily transmit therethrough. When the grain boundaries are linearly formed in the I layer from the interface between the n-type layer and the I layer to the interface between the p-type layer and the I layer, the leakage current is easily generated between the n-type layer and the p-type layer through the grain boundaries. Therefore, when the I layer formed of the single layer is thinly formed, short grain boundaries are formed between the n-type layer and the p-type layer, and the OFF current in the application of the reverse-bias voltage becomes large, and therefore, writing error and erasing error occur in the phase-change memory, and the reliability of the nonvolatile semiconductor memory device is lowered.

If a length of the grain boundary connecting between the n-type layer and the p-type layer is long, the leakage current does not easily flow, and therefore, a method of thickening the I layer in order to prevent the generation of the leakage current is conceivable. That is, in the polysilicon PIN diode formed of three layers of the p-type layer, the I layer, and the n-type layer, the OFF current (leakage current) in the application of the reverse-bias voltage can be sufficiently reduced by sufficiently thickening the I layer.

However, if the microfabrication of the phase-change memory is promoted, it is required to form a height of the column-shaped polysilicon diode as sufficiently low. If the polysilicon diode is too high, an aspect ratio (AR) of a height of a polysilicon diode pattern in a direction vertical to the main surface of the semiconductor substrate with respect to a width of the polysilicon diode pattern in a direction along the main surface of the semiconductor substrate becomes too large, and therefore, it is difficult to process the pattern. Moreover, there is a possibility that the processed pattern is collapsed and the polysilicon diode cannot be formed.

Therefore, if the generation of the leakage current is prevented by thickening the I layer formed of the single-layer polysilicon film, it is required to form a width of the polysilicon diode pattern as a certain value or larger, and therefore, the microfabrication of the phase-change memory becomes difficult.

Therefore, in order to promote the microfabrication, it is required to sufficiently thicken the I layer forming the polysilicon diode without lowering the reliability of the nonvolatile semiconductor memory device.

A preferred aim of the present invention is to prevent the generation of the reverse-bias OFF current in the polysilicon diode of the nonvolatile semiconductor memory device.

Also, another preferred aim of the present invention is to achieve the microfabrication of the nonvolatile semiconductor memory device.

Further, the present invention achieves the above-described preferred aims at the same time.

The above and other preferred aims and novel characteristics of the present invention will be apparent from the description of the present specification and the accompanying drawings.

The typical ones of the inventions disclosed in the present application will be briefly described as follows.

In a nonvolatile semiconductor memory device according to an invention of the present application, the nonvolatile semiconductor memory device includes: a plurality of first wires formed above a semiconductor substrate and extending in a first direction of a main surface of the semiconductor substrate; a plurality of diodes formed above the respective plurality of first wires at a predetermined interval; a plurality of nonvolatile memories formed above the plurality of diodes and electrically connected to the plurality of diodes; and a plurality of second wires formed above the plurality of nonvolatile memories and extending in a second direction orthogonal to the first direction. Each of the plurality of diodes functions as a selective element of each of the plurality of nonvolatile memories, each of the plurality of diodes has a column-shaped stacked structure vertically stacked above the main surface of the semiconductor substrate, the stacked structure including: a first-conductivity type semiconductor layer having a first resistivity, formed above each of the plurality of first wires and electrically connected to the plurality of first wires; a plurality of polycrystalline semiconductor layers each having a second resistivity higher than the first resistivity, stacked above the first-conductivity type semiconductor layer; and a second-conductivity type semiconductor layer having a third resistivity lower than the second resistivity, formed above the plurality of polycrystalline semiconductor layers and electrically connected to the plurality of nonvolatile memories, and the plurality of first wires and the plurality of second wires configure word lines and bit lines for selecting the plurality of nonvolatile memories.

Also, in a manufacturing method of a nonvolatile semiconductor memory device according to an invention of the present application, the nonvolatile semiconductor memory device includes: a plurality of first wires formed above a semiconductor substrate and extending in a first direction of a main surface of the semiconductor substrate; a plurality of diodes formed above the respective plurality of first wires at a predetermined interval; a plurality of nonvolatile memories formed above the plurality of diodes and electrically connected to the plurality of diodes; and a plurality of second wires formed above the plurality of nonvolatile memories and extending in a second direction orthogonal to the first direction. Each of the plurality of diodes functions as a selective element of each of the plurality of nonvolatile memories, each of the plurality of diodes has a column-shaped stacked structure vertically stacked above the main surface of the semiconductor substrate, the stacked structure including: a first-conductivity type semiconductor layer having a first resistivity, formed above each of the plurality of first wires and electrically connected to the plurality of first wires; a plurality of polycrystalline semiconductor layers each having a second resistivity higher than the first resistivity, stacked above the first-conductivity type semiconductor layer; and a second-conductivity type semiconductor layer having a third resistivity lower than the second resistivity, formed above the plurality of polycrystalline semiconductor layers and electrically connected to the plurality of nonvolatile memories, and the plurality of first wires and the plurality of second wires configure word lines and bit lines for selecting the plurality of nonvolatile memories. And, the manufacturing method includes the steps of: (a) above the semiconductor substrate, sequentially forming a first metal film, the first-conductivity type semiconductor layer, a plurality of semiconductor layers each having the second resistivity higher than the first resistivity, and the second-conductivity type semiconductor layer; (b) processing the second-conductivity type semiconductor layer, the plurality of semiconductor layers, the first-conductivity type semiconductor layer, and the first metal film in a stripe shape along the first direction to form a plurality of first patterns each of which includes the plurality of first wires formed of the first metal film, the first-conductivity type semiconductor layer formed above each of the plurality of first wires, the plurality of semiconductor layers, and the second-conductivity type semiconductor layer; (c) burying a space between the plurality of first wires and a space between the plurality of first patterns by a first insulating film, and then, exposing each upper surface of the plurality of first patterns; (d) processing the first insulating film and the plurality of first patterns in a stripe shape along the second direction to form a plurality of second patterns each of which includes the first insulating film and the plurality of first patterns; (e) burying a space between the plurality of second patterns by an interlayer insulating film, and then, exposing each upper surface of the plurality of second patterns; and (f) after the step of (a), crystallizing the plurality of semiconductor layers by a thermal treatment to form the plurality of polycrystalline semiconductor layers. And, the manufacturing method forms the plurality of diodes each formed of: the first-conductivity type semiconductor layer; the plurality of polycrystalline semiconductor layers; and the second-conductivity type semiconductor layer.

The effects obtained by typical aspects of the present invention will be briefly described below.

According to the present invention, in the polysilicon diode which is the selective element of the nonvolatile semiconductor memory device, the generation of the reverse-bias OFF current can be prevented.

Also, the microfabrication of the nonvolatile semiconductor memory device can be achieved.

Further, the above-described preferred aims can be achieved at the same time.

BRIEF DESCRIPTIONS OF THE DRAWINGS

FIG. 29 is a graph illustrating a relation between an aspect ratio of a diode and a processing rule;

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted. Also, in the following embodiments, the description for the same or similar part is omitted in principle unless otherwise particularly required.

Further, in some drawings used in the following embodiments, hatching may be partially omitted even in a cross-sectional view so as to make the drawings easy to see.

First Embodiment

The present embodiment describes a nonvolatile semiconductor memory device includes: a chain-memory type memory matrix in which a plurality of self-aligned memory cells are vertically arranged at intersections of bit lines and word lines; diodes as selective elements; and phase-change memories as memory elements.

Figure 1:
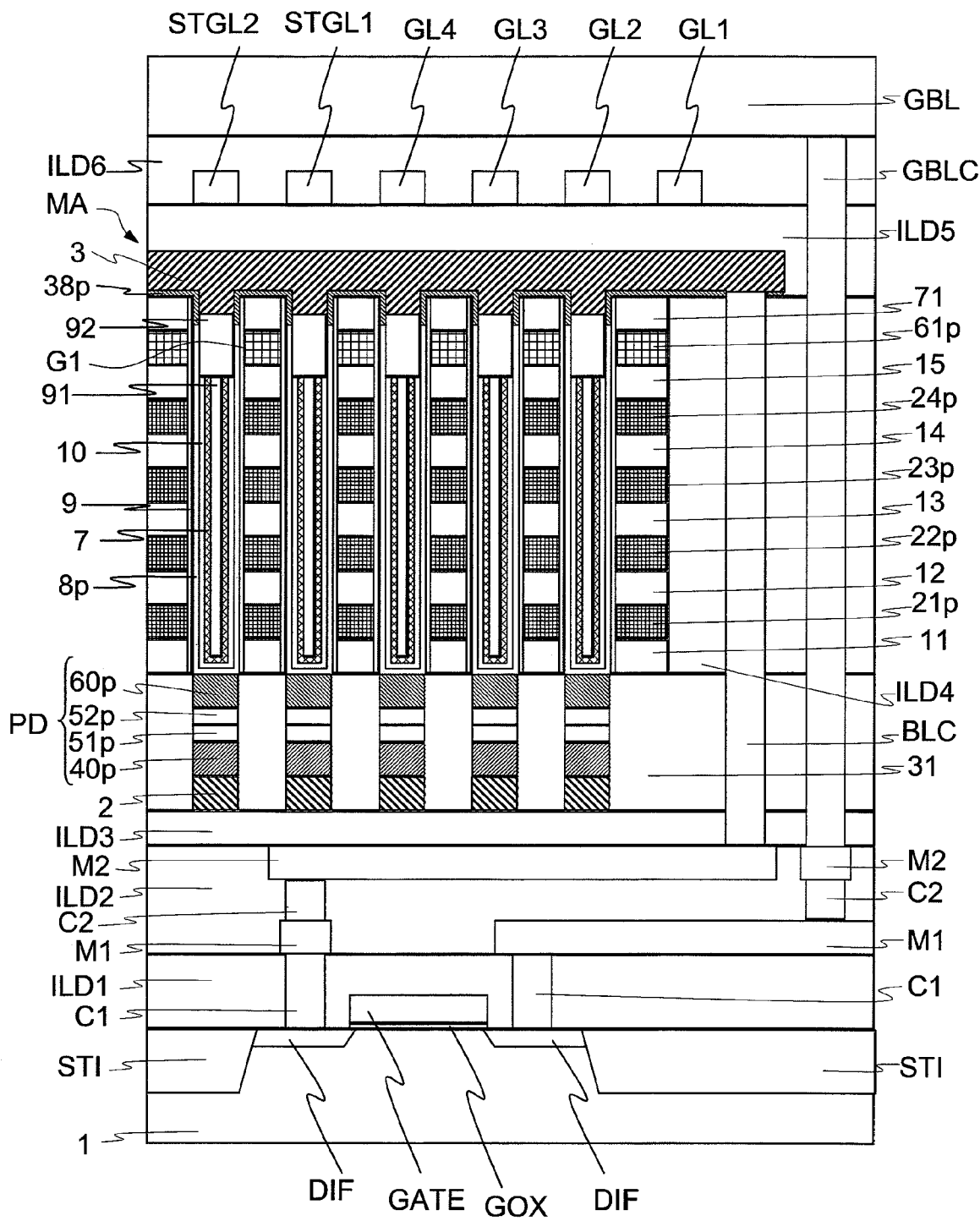
FIG. 1 is a cross-sectional view of a principal part of a memory matrix of a nonvolatile semiconductor memory device according to a first embodiment of the present invention.

First, a part of a cross-sectional view of a vertical-type chain memory according to the present embodiment is illustrated in FIG. 1. FIG. 1 is a cross-sectional view of a principal part of the nonvolatile semiconductor memory device according to the present embodiment, and illustrates apart of a memory cell array, a wire, and a contact plug. A gate electrode GATE is formed on a semiconductor substrate 1 via a gate insulating film GOX, a diffusion layer DIF is formed in an upper surface of the semiconductor substrate so as to sandwich the semiconductor substrate 1 below the gate electrode GATE, and the diffusion layer DIF and the gate electrode GATE configure a field-effect transistor which selects a word line 2 or a bit line 3. An element isolation layer (shallow trench isolation layer) STI is formed in the upper surface of the semiconductor substrate 1 so as to be in contact with the diffusion layer DIF, an interlayer insulating film ILD1 is formed above the semiconductor substrate 1 so as to cover the gate electrode GATE and the element isolation layer STI, and interlayer insulating films ILD2 and ILD3, an insulating layer 31, interlayer insulating films ILD4, ILD5, and ILD6, and a global bit line GBL are formed above the interlayer insulating film ILD1 sequentially from the semiconductor substrate 1 side.

Wire layers M1 and M2 are formed in lower and upper portions in the interlayer insulating film ILD2, respectively, and the wire layer M2 is electrically connected to the diffusion layer DIF via a contact plug C2 formed between the wire layers M2 and M1, the wire layer M1, and a contact plug C1 penetrating through the interlayer insulating film ILD1. The insulating layer 31 includes a plurality of column-shaped polysilicon diodes PD penetrating from an upper surface of the insulating layer 31 to a lower surface thereof. Each of the plurality of polysilicon diodes PD includes: a polysilicon layer 40p to which a p-type impurity is doped; a polysilicon layer 51p to which a low-concentration impurity is doped; a polysilicon layer 52p to which a low-concentration impurity is doped; and a polysilicon layer 60p to which an n-type impurity is doped, the polysilicon layers being sequentially formed above the word line 2 formed of a metal wire above the interlayer insulating film ILD3.

Above the insulating layer 31 which is the same layer as the interlayer insulating film ILD 4 and is in a region adjacent to the polysilicon diode PD, an insulating layer 11, a gate polysilicon layer 21p, an insulating layer 12, a gate polysilicon layer 22p, an insulating layer 13, a gate polysilicon layer 23p, an insulating layer 14, a gate polysilicon layer 24p, an insulating layer 15, a gate polysilicon layer 61p, and an insulating layer 71 are formed sequentially from the insulating layer 31 side. Each of the gate polysilicon layers 21p to 24p and 61p functions as a gate of a selective transistor which selects the phase change memory.

Above each of the plurality of polysilicon diodes PD, a trench G1 extending from an upper surface of the insulating layer 71 to an upper surface of each of the plurality of polysilicon diodes PD is formed, and a gate insulating layer 9 is formed on an inner wall of the trench G1. A polysilicon layer 8p covering an inner wall and a bottom portion of the trench G1 is formed inside the trench G1, and an insulating layer 10, a phase-change material layer 7, and an insulating layer 91 are buried therein via the polysilicon layer 8p from the bottom portion of the trench G1 up to a height of the same layer as the insulating layer 15. Inside the trench G1, the polysilicon layer 8p, the insulating layer 10, the phase-change material layer 7, and the insulating layer 91 are formed sequentially from the inner wall and the bottom portion of the trench G1. An insulating layer 92 is formed above the insulating layer 10, the phase-change material layer 7, and the insulating layer 91, which are in the trench G1. A polysilicon layer 38p is formed above the polysilicon layer 8p so as to cover the inner wall of the trench G1 and each upper surface of the gate insulating layer 9, the insulating layer 71, and the interlayer insulating film ILD4. The polysilicon layer 38p is electrically connected to the polysilicon layer 8p and the bit line 3 above the polysilicon layer 38p.

The bit line 3 formed of a metal wire is formed above the polysilicon layer 38p and the insulating layer 92. A contact plug BLC which penetrates through the polysilicon layer 38p, the interlayer insulating film ILD4, the insulating layer 31, and the interlayer insulating film ILD3, is formed above the wiring layer M2 and below the bit line 3 above the interlayer insulating film ILD4. The bit line 3 and the diffusion layer DIF are electrically connected to each other via the contact plug BLC and the wire layer M2, and the bit line 3 is connected to another circuit.

Gate wires STGL1 and STGL2 and gate wires GL1, GL2, GL3, and GL4 are arranged in a stripe shape above the interlayer insulating film ILD5. The global bit line GBL above the interlayer insulating film ILD6 and the wire layer M1 are electrically connected to each other via a contact plug GBLC penetrating through the interlayer insulating films ILD3 to ILD6 and the insulating layer 31, the wire layer M2, and the contact plug C2.

Here, a region including: the polysilicon diodes PD; the gate polysilicon layers 21p to 24p; the gate polysilicon layer 61p; the phase-change material layer 7; the polysilicon layers 8p and 38p; the gate insulating layer 9; the bit line 3; and the word line 2 is referred to as a memory cell array MA.

The polysilicon layer 40p illustrated in FIG. 1 is a polysilicon film to which a p-type impurity is doped, and works as a p-type layer of the polysilicon diode PD which is a PIN diode. The polysilicon layers 51p and 52p are polysilicon films to which an impurity is doped at a lower concentration than those of the polysilicon layers 40p and 60p, have higher resistance than those of the polysilicon layers 40p and 60p, and function as an I layer (Intrinsic layer, electric-field relaxation layer) of the polysilicon diode PD which is the PIN diode. The impurity doped into the polysilicon layers 51p and 52p may be either a p-type impurity (for example, B (boron)) or an n-type impurity (for example, P (phosphorous)). Also, the polysilicon layers 51p and 52p may be intrinsic semiconductor layers such as non-doped silicon layers to which no impurity is doped. Further, the polysilicon layers 51p and 52p have the two-layer stacked structure, and therefore, one of the polysilicon layers 51p and 52p may be a layer containing the impurity and the other may be a layer containing no impurity.

Further, the polysilicon layers 51p and 52p are formed between the polysilicon layers 40p and 60p made of silicon, and therefore, it is desirable to use a member which can be joined with the polysilicon layers 40p and 60p with good joint performance. That is, for the polysilicon layers 51p and 52p, a compound containing silicon or a member containing a semiconductor element of the Group 14 whose group is the same as silicon may be used, and it is preferable to use, for example, Si (silicon), Ge (germanium), SiC (silicon carbide), SiGe (silicon germanium), or others.

The polysilicon layer 60p is a polysilicon film to which an n-type impurity is doped, and works as an n-type layer of the polysilicon diode PD which is the PIN diode. The phase-change material layer 7 is a layer made of a phase-change material such as $Ge_2Sb_2Te_5$, and is a layer which becomes a current path together with the polysilicon layers 8p and 38p when the selective transistor including the gate polysilicon layers 21p to 24p and 61p is turned ON to supply the current. The insulating layer 10 is a layer for preventing diffusion between the phase-change material layer 7 and the polysilicon layer 8p, and has a thin film thickness of about 1 nm. While the insulating layer 10 is a film having a high insulation property, it has a low-resistance property that easily allows the flow of electricity in a film-thickness direction since the film thickness thereof is thin.

Figure 2:
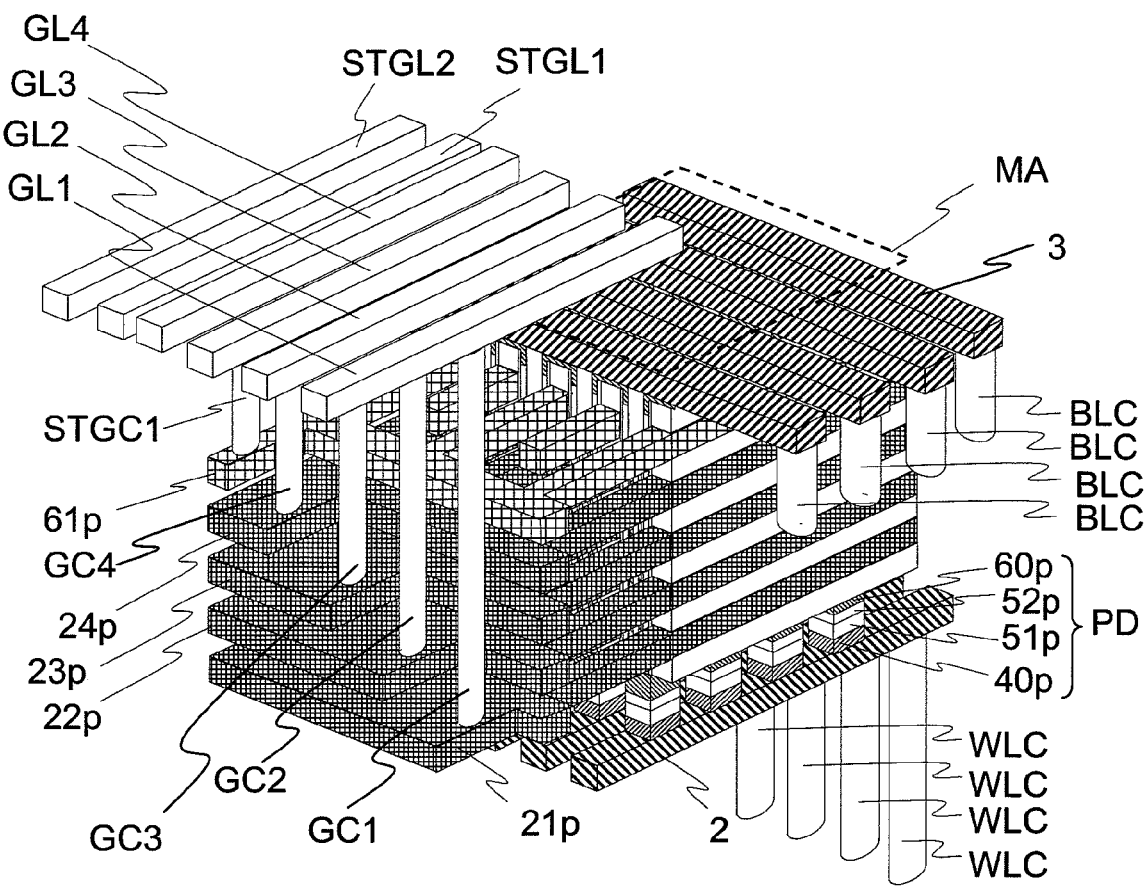
FIG. 2 is an overhead view of the memory matrix of the nonvolatile semiconductor memory device according to the first embodiment of the present invention.

FIG. 2 is an overhead view illustrating a part of the nonvolatile semiconductor memory device according to the present embodiment. FIG. 2 illustrates a part of the memory cell array, the wires, and the contact plugs. Note that, in FIG. 2, the interlayer insulating films ILD1 to ILD6, the insulating layer 31, and the semiconductor substrate 1 are not illustrated in order to understandably see the arrangement of wires, and only the memory cell array MA and the wires and contact plugs connected to the memory cell array MA are illustrated.

As illustrated in FIG. 2, contact plugs WLC connecting between the word line 2 and the field-effect transistors formed above the semiconductor substrate 1 (see FIG. 1) are formed below the word lines 2. Moreover, contact plugs BLC connecting between the bit lines 3 and the field-effect transistors formed above the semiconductor substrate 1 (see FIG. 1) are formed below the bit lines 3.

The bit line 3 and the word line 2 are formed of a plurality of metal wires extending in a stripe shape in a direction along the main surface of the semiconductor substrate 1 (see FIG. 1). In an upper layer of the memory cell array MA, gate wires STGL1 and STGL2 for supplying power to the gate polysilicon layer 61p of the selective transistors are extended in the same direction as the word line 2. In the same layer as the layer of the gate wires STGL1 and STGL2, the gate wires GL1, GL2, GL3, and GL4 extending parallel to the gate wires STGL1 and STGL2 are formed. The word line 2 and the bit line 3 are metal wires for selecting the phase-change memory.

Although not illustrated in FIG. 2, each of the gate wires GL1 to GL4 is connected to a peripheral circuit formed above the semiconductor substrate 1 (see FIG. 1) via a contact plug. Also, each of the gate wires STGL1 and STGL2 is connected to a peripheral circuit via a contact plug.

In FIG. 2, the gate polysilicon layers 21p to 24p and 61p are illustrated such that a pattern of the alternately-arranged stripes is uniformly connected to each other in each of the layers. Other stripe patterns as if they are isolated is similarly uniformly connected to each other on the other side of an extending direction of the word line 2 so as to interpose the memory cell array MA, and each of the patterns is connected to the gate wires GL1 to GL4 and STGL2 via the contact plugs GC1, GC2, GC3, GC4 and STGC1.

That is, as illustrated in FIG. 2, in the plurality of gate polysilicon layers 21p to 24p illustrated in FIG. 1, alternately-arranged stripe lines are uniformed in each layer, and the gate polysilicon layers 21p to 24p are electrically connected to the gate wires GL1 to GL4 via the contact plugs GC1 to GC4, respectively. Similarly, in the plurality of gate polysilicon layers 61p, all of the stripe lines are not uniformed, and both adjacent gate polysilicon layers 61p to one gate polysilicon layer 61p are connected to the gate wire STGL2 via a contact plug (not illustrated). Also, the other both adjacent gate polysilicon layers 61p to the above-described gate polysilicon layer 61p connected to the gate wire STGL2 are electrically connected to the gate wire STGL1 via the contact plug STGC1.

Therefore, in the gate polysilicon layer 21p of the memory cell, all of the adjacent stripe patterns to each other are connected to the gate wire GL1. The gate polysilicon layers 22p, 23p, and 24p are similarly connected to the gate wires GL2 to GL4, respectively. In the gate polysilicon layer 61p of the selective transistor, each of the stripe lines is alternately connected to the two gate wires STGL1 and STGL2 which are insulated from each other, and a voltage can be independently applied thereto.

Figure 3:
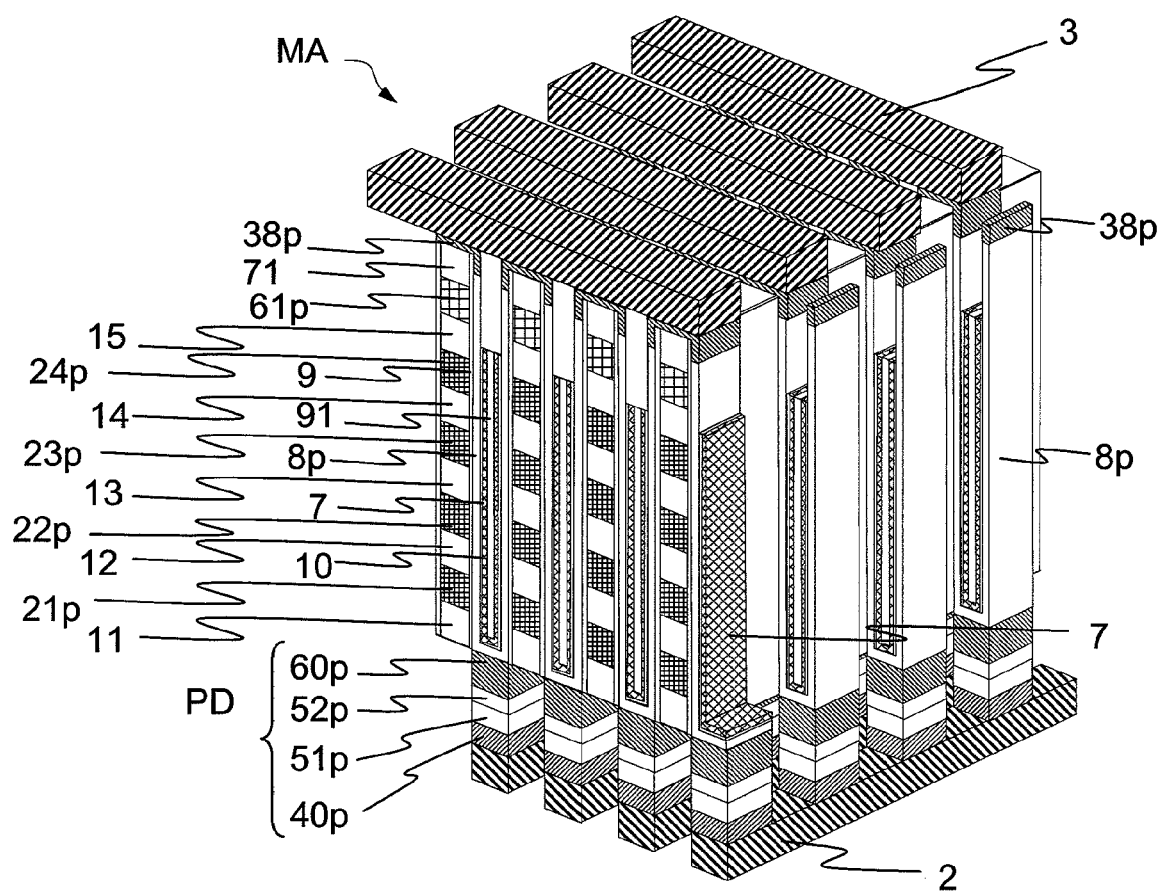
FIG. 3 is an overhead view illustrating a part of the memory matrix of the nonvolatile semiconductor memory device according to the first embodiment of the present invention.

FIG. 3 is an overhead view illustrating to extract particularly a portion of the memory cell array MA. Here, the insulating layer 31 (see FIG. 1) and other insulating films outside the memory cell array MA are not illustrated. As illustrated in FIG. 3, above the plurality of word lines 2, the polysilicon diode PD is periodically formed in the extending direction of the word line 2. Moreover, below the plurality of bit lines 3, the polysilicon diode PD is periodically formed in the extending direction of the bit line 3 in a matrix shape inside the memory cell array MA.

The stacked film including: the gate polysilicon layers 21p to 24p and 61p; and the insulating layers 11 to 15 and 71 is patterned in a stripe shape in a direction parallel to the word line 2. A line portion of the stripe of the stacked film including the gate polysilicon layers 21p to 24p and 61p and the insulating layers 11 to 15 and 71 is arranged immediately above a region between the word lines 2. Also, a region (the trench G1 illustrated in FIG. 1) between the stripes of the stacked film including the gate polysilicon layers 21p to 24p and 61p and the insulating layers 11 to 15 and 71 is positioned immediately above the word line 2. The bit line 3 has a stripe shape extending in a direction orthogonal to the word line 2, and is arranged above the insulating layer 71 via the n-type polysilicon layer 38p. The bit line 3 and the polysilicon diode PD are connected to each other via the polysilicon layer 38p and the polysilicon layer 8p on both side surfaces of the stacked film including the gate polysilicon layers 21p to 24p and 61p and the insulating layers 11 to 15 and 71.

The polysilicon layers 8p and 38p, the phase-change material layer 7, and the insulating layer 10 are not formed in a region between the stacked films each including the gate polysilicon layers 21p to 24p and 61p and the insulating layers 11 to 15 and 71 and below a region between the bit lines 3, and the region becomes a space portion between the polysilicon diodes PD above the word line 2. Although omitted in FIG. 3 in order to understandably see the figure, the insulating layer 31 is buried in the space portion between the polysilicon diodes PD.

In the nonvolatile semiconductor memory device of the present invention, information is stored by using the different resistivity between the amorphous state and the crystalline state as the state of the phase-change material such as $Ge_2Sb_2Te_5$ contained in the phase-change material layer 7. The phase-change material layer 7 has a high resistance in the amorphous state and has a low resistance in the crystalline state. Therefore, the reading of the phase-change memory can be performed by applying a voltage differential to both ends of a resistance variable element (phase-change material layer 7), measuring a current flowing through the element, and distinguishing either the high-resistance state or the low-resistance state in the element.

Figure 4:
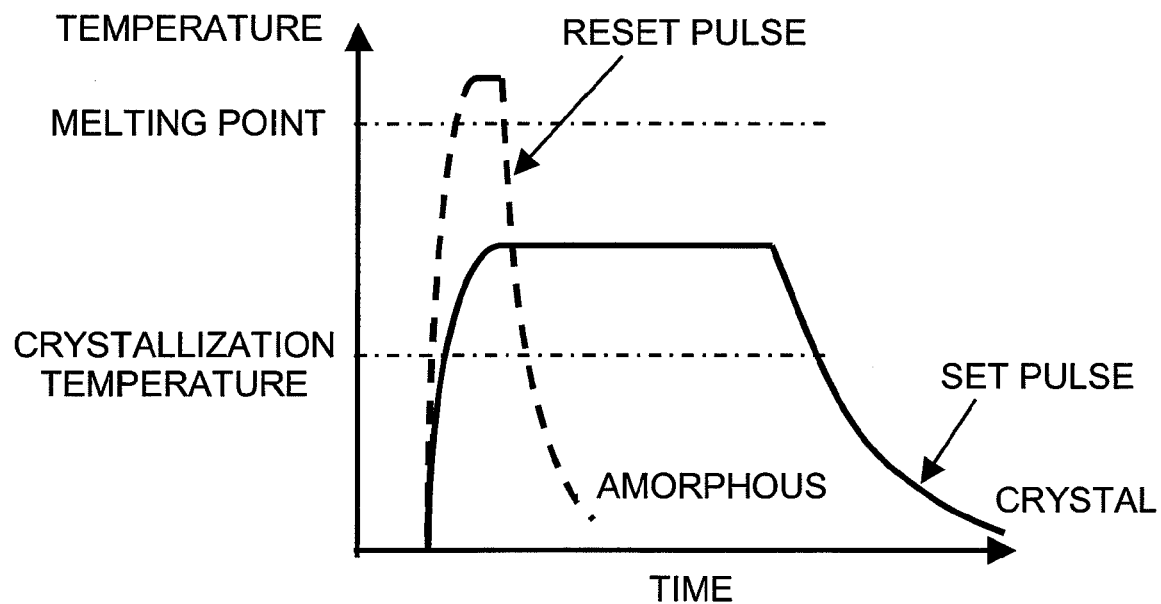
FIG. 4 is a graph illustrating a relation among a melting point and a crystallization temperature of a phase-change material and time for current flow.

FIG. 4 is a graph illustrating the temperature change of a recording layer (phase-change material layer) in the rewriting operation of the phase-change memory of the present embodiment of the present invention, a horizontal axis represents time, and a vertical axis represents a temperature of the phase-change material layer. For an operation of changing the phase-change material from the amorphous state which is the high-resistance state to the crystalline state which is the low-resistance state, that is set operation (writing operation) and for an operation of reversely changing it from the crystalline state which is the low-resistance state to the amorphous state which is the high-resistance state, that is reset operation (erasing operation), the temperature change as illustrated in FIG. 4 is applied to the phase-change material. More specifically, the phase-change material in the amorphous state can be changed to a crystalline-state layer by heating the phase-change material at a crystallization temperature or higher and maintaining the temperature for, for example, about $10^{-6}$ seconds. Also, the phase-change material in the crystalline state can be changed to a solid layer in the amorphous state by heating the phase-change material at a temperature of a melting point or higher to be a liquid state, and then, rapidly cooling it.

Figure 5:
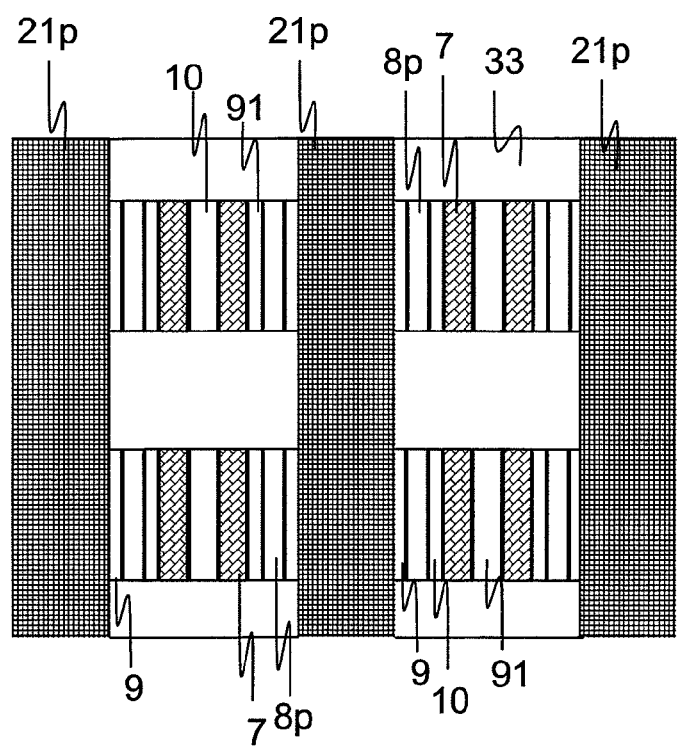
FIG. 5 is another cross-sectional view of the principal part of the memory matrix of the nonvolatile semiconductor memory device according to the first embodiment of the present invention.

Here, a cross-sectional view of the memory cell array of the present embodiment in a plane along the main surface of the semiconductor substrate is illustrated in FIG. 5. FIG. 5 is a planar cross-sectional view of the memory cell array MA in the region including the gate polysilicon layer 21p and the phase-change material layer 7. As illustrated in FIG. 5, the gate polysilicon layer 21p is arranged in the stripe shape along the main surface of the semiconductor substrate, and a plurality of memory cells divided by an insulating layer 33 are arranged and disposed in the extending direction of the gate polysilicon layer 21p. Here, only four memory cells arranged in a matrix shape are illustrated.

Figure 6:
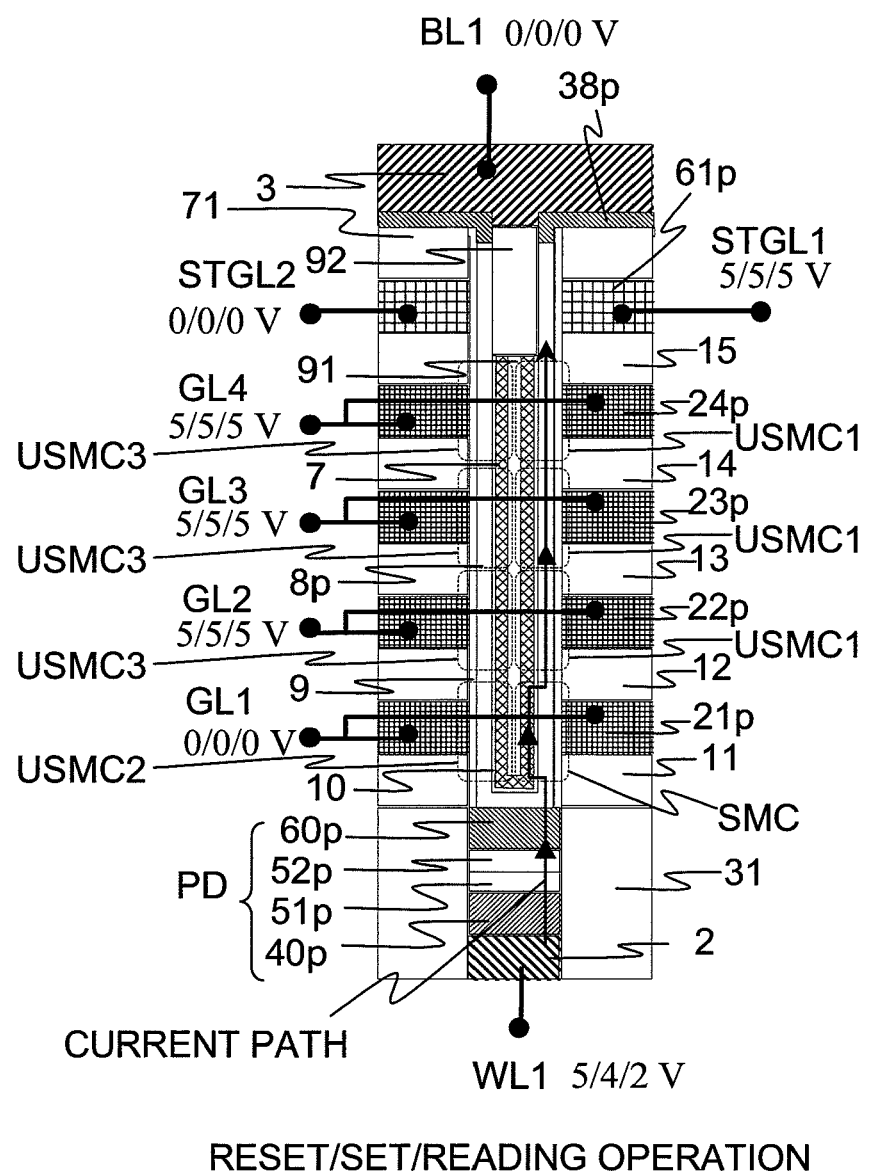
FIG. 6 is still another cross-sectional view of the principal part of the memory matrix of the nonvolatile semiconductor memory device according to the first embodiment of the present invention.
Figure 7:
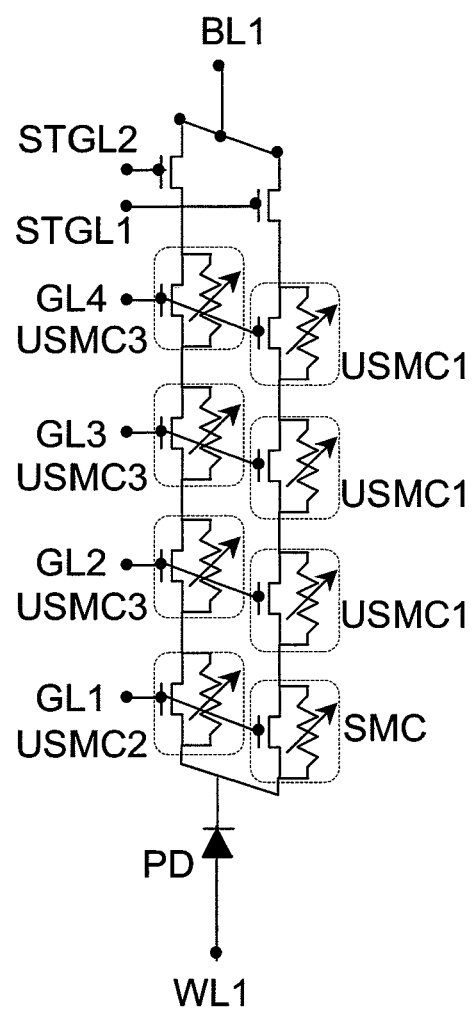
FIG. 7 is an equivalent circuit diagram of the memory matrix of the nonvolatile semiconductor memory device according to the first embodiment of the present invention.
Figure 8:
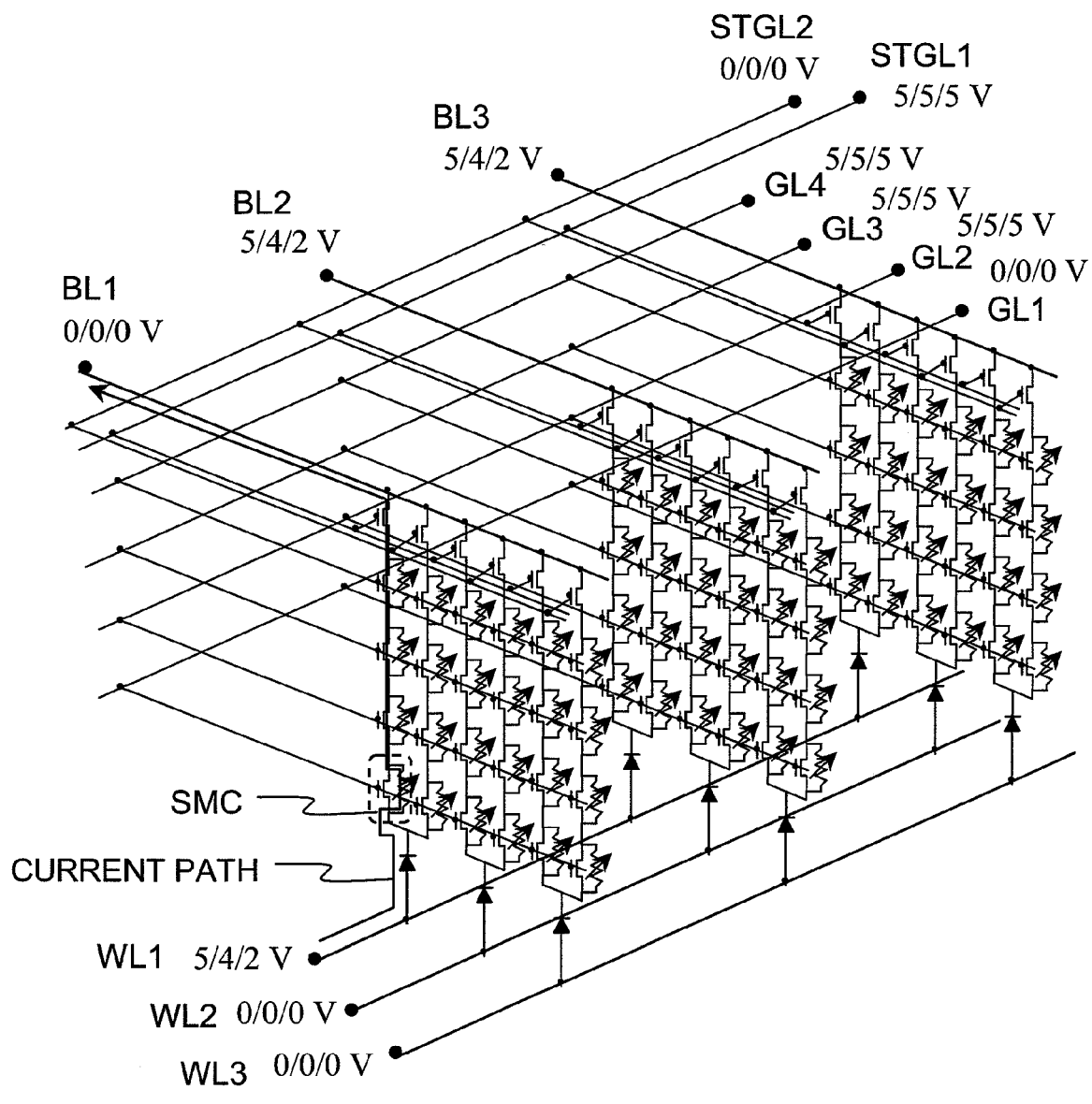
FIG. 8 is another equivalent circuit diagram of the memory matrix of the nonvolatile semiconductor memory device according to the first embodiment of the present invention.

Next, operations of the phase-change memory of the present embodiment will be described with reference to FIGS. 6 to 8. FIG. 6 illustrates to extract a pair of memory cells (vertical-type chain memories) above one polysilicon diode PD in the memory cell array MA of the present embodiment. Also, FIG. 7 illustrates an equivalent circuit diagram of the pair of memory cells illustrated in FIG. 6. FIG. 8 illustrates an equivalent circuit diagram of the memory cell array and wires for supplying a potential to the memory cell array. The pair of memory cells as referred here is formed above the one column-shaped polysilicon diode PD illustrated in FIG. 6, and is formed of: the phase-change material layer 7; the insulating layer 10; the polysilicon layer 8p; and the gate insulating layer 9, which are inside the trench G1; and the gate polysilicon layers 21p to 24p and 61p adjacent to the trench G1. Here, FIG. 6 illustrates eight memory cells (selected cell SMC and unselected cells USMC1 to USMC3 illustrated in FIG. 6) formed of the phase-change material layer 7 in vicinities of the gate polysilicon layers 21p to 24p.

Hereinafter, a method of writing (storing), erasing, or reading information is described, the method being performed by activating only the selected cell SMC including the phase-change material layer 7 in a vicinity region of one gate polysilicon layer 21p of the two gate polysilicon layers 21p in the pair of memory cells illustrated in FIG. 6 to cause the phase change in only the phase-change material layer 7 in the selected cell SMC.

Note that FIG. 6 does not illustrate the gate wires GL1 to GL4, STGL1, and STGL2, and illustrates only their symbols in order to understandably see connection destinations of the gate polysilicon layers 21p to 24p and 61p. Also, below the symbols of the gate wires GL1 go GL4, STGL1, and STGL2, voltages applied to the gate wires GL1 to GL4, STGL1 and STGL2 are shown in the respective operations in an order of reset (erasing) operation, set (writing) operation, and reading operation.

The operations of each memory cell are performed as follows. First, a voltage of 0 V is applied to the gate wire GL1 to which the selected cell SMC illustrated in FIG. 6 is connected, so that a transistor which uses the polysilicon layer 8p in the vicinity of the gate wire GL1 as a channel is turned OFF. A voltage of 5 V is applied to the gate wires GL2 to GL4 to which the selected cell SMC is not connected, so that a transistor which uses each of the gate wires GL2 to GL4 as a gate is turned ON. A voltage of 0 V is applied to the bit line BL1, and voltages of 5, 4, and 2 V are applied to the word line WL1 in the reset operation, the set operation, and the reading operation, respectively. A voltage of 5 V is applied to a gate on a connection side with the selected cell SMC, that is the gate wire STGL1, so that a transistor is turned ON. A voltage of 0 V is applied to a gate on a non-connection side with the SMC, that is the gate wire STGL2, so that a transistor is turned OFF.

The transistor of the unselected cell USMC1 in the vicinity of the gate polysilicon layer 21p is ON, and therefore, a resistance of the channel (polysilicon layer 8p) is low, and a resistance of the polysilicon layer 8p of the gate wire STGL1 which is ON is also low. In this case, in the vicinities of the unselected cells USMC1, a current of almost same magnitude can be flown through the polysilicon layer 8p instead of the phase-change material layer 7 regardless of states of the phase-change material layers 7 in the unselected cells USMC1. In the selected cell SMC, since the transistor is OFF, a current is flown through the phase-change material layer 7.

In the reset operation and the set operation, the operations are performed by changing the state of the phase-change material layer 7 by the current flowing through the phase-change material layer 7 in the selected cell SMC to change the resistivity. In the reading operation, the operation is performed by determining a value of the current flowing through the phase-change material layer 7 of the selected cell SMC. The transistors of the unselected cell USMC2 and USMC3 share a gate voltage with the transistors of the selected cell SMC and the unselected cells USMC1, respectively, and therefore, the transistor of the unselected cell USMC2 is OFF, and the transistor of the unselected cell USMC3 is ON. However, the selected transistor which uses the gate polysilicon layer 61p as the gate to which the gate wire STGL2 is connected is OFF, and therefore, a current flowing through the unselected cells USMC2 and USMC3 is not flown. Therefore, a condition that the current is flown through the phase-change material layer 7 is caused in only the phase-change material layer 7 in the vicinity of the selected cell SMC, and therefore, such a selective operation can be achieved.

The memory cell array of the present embodiment is configured of: a plurality of bit lines; a plurality of word lines; a plurality of vertical-type chain memories; and a plurality of polysilicon diodes PD. FIG. 8 illustrates a potential relation among the bit lines BL1 to BL3, the word lines WL1 to WL3, and the gate wires GL1 to GL4, STGL1 and STGL2 when the reset operation, the set operation, and the reading operation are performed.

The numerical values shown in the vicinities of the word lines WL1 to WL3, the bit lines BL1 to BL3, and the gate wires GL1 to GL4, STGL1, and STGL2 in the equivalent circuit diagram of the memory cell array illustrated in FIG. 8 are the potentials in the reset operation, the set operation, and the reading operation as similarly to FIG. 6. For example, the showing of 5/4/2 V in the vicinity of the word line WL1 indicates that a voltage of 5 V is applied to the word line WL1 in the reset operation, a voltage of 4 V is applied to the word line WL1 in the set operation, and a voltage of 2 V is applied to the word line WL1 in the reading operation.

Similarly to the showing of the potentials of other terminals in FIG. 8, the numerical values also indicate sequentially the potentials in the reset operation, the set operation, and the reading operation. In the vertical-type chain memory connected to the bit line BL2 or BL3 and connected to the word line WL1, the potentials of the bit line BL2 or BL3 and the word line WL1 are both 5 V in the reset operation, both 4 V in the set operation, and both 2 V in the reading operation, and therefore, there is no potential difference between the bit line BL2 or BL3 and the word line WL1, and thus, the current is not flown therethrough. Also, in the vertical-type chain memory connected to the bit line BL1 and the word line WL2 or WL3, the potentials of the bit line and the word line are both 0 V in the reset operation, the set operation, and the reading operation, and therefore, there is no potential difference, and thus, the current is not flown therethrough. Further, in the vertical-type chain memory connected to the bit line BL2 or BL3 and the word line WL2 or WL3, the potentials of 0 V and 5 V are applied to the word line and the bit line in the reset operation, the potentials of 0 V and 4 V are applied to the word line and the bit line in the set operation, and the potentials of 0 V and 2 V are applied to the word line and the bit line in the reading operation, respectively, and therefore, a voltage is applied in a reverse bias direction to the polysilicon diode PD which selects the vertical-type chain memory, and therefore, the current is not flown therethrough. A breakdown voltage of the polysilicon diode PD is determined by the leakage current through the crystal grain boundaries of polysilicon in the polysilicon layers 51p and 52p which are electric-field relaxation layers illustrated in FIG. 1. In this case, it is required to set the breakdown voltage of the polysilicon diode PD to be higher than 5 V.

As illustrated in the current path of FIG. 8, only in the vertical-type chain memory connected to the bit line BL1 and the word line WL1, a forward-bias voltage is applied to the polysilicon diode PD, and therefore, the current is flown therethrough. By the method described in FIG. 6, the selected cell SMC in the vertical-type chain memory can be selected and operated. Therefore, only the selected cell SMC in the memory cell array can be selected to perform the writing, erasing, and reading operations of the information therein.

In the polysilicon diode PD which is essential to an operation of the memory cell array, it is required to reduce a leakage current in the application of the reverse-bias voltage in order to enable the operation of the memory cell array. As a method of reducing a leakage current in the application of the reverse-bias voltage, a method of preventing to generate the leakage current by increasing a height of the I layer in the PIN-type polysilicon diode is conceivable. However, if the height of the I layer is increased, a height of the polysilicon diode in a direction vertical to the main surface of the semiconductor substrate with respect to a width of the polysilicon diode in a direction along the main surface of the semiconductor substrate is increased (the aspect ratio is increased), and therefore, the processing is difficult. That is, for the polysilicon diode PD, it is required to provide a processable shape and a small aspect ratio.

In the present embodiment, in order to achieve the polysilicon diode PD in which the generation of the leakage current in the polysilicon diode PD in the application of the reverse-bias voltage is prevented and an aspect ratio capable of preventing the pattern collapse is provided, the field-effect relaxation layer (I layer) of the polysilicon diode PD is formed of two layers of the polysilicon layers 51p and 52p.

Hereinafter, an example of a manufacturing method of the nonvolatile semiconductor memory device of the present embodiment is described with reference to FIGS. 9 to 23. Note that each of FIGS. 9 to 22 illustrates an overhead view of a part in the memory cell array MA illustrated in FIG. 1, and an illustration of a region below the interlayer insulating film ILD3 below the polysilicon diode PD is omitted.

Figure 9:
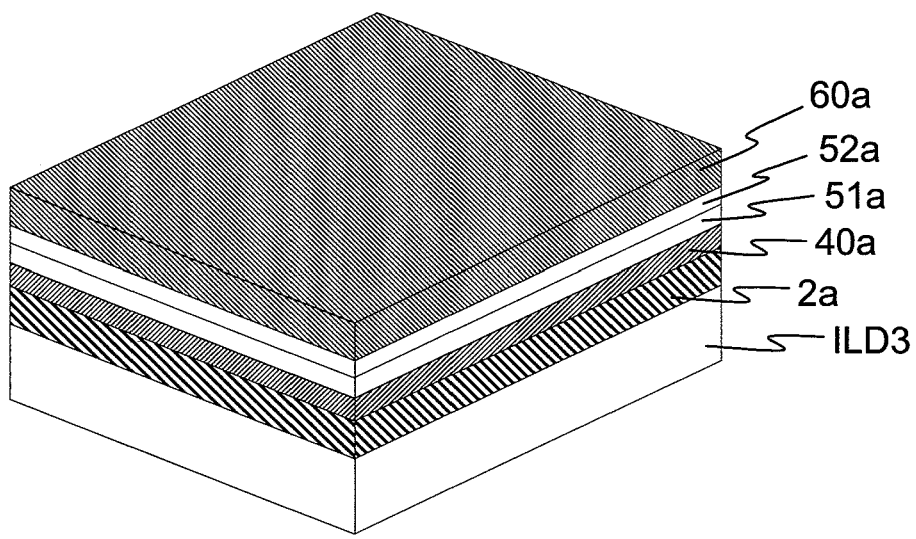
FIG. 9 is an overhead view illustrating a manufacturing method of the nonvolatile semiconductor memory device according to the first embodiment of the present invention.

First, as illustrated in FIG. 9, the interlayer insulating film ILD3 is formed by an already-known method above the structure (not illustrated) including the wire layer M2 and the lower members above the main surface of the semiconductor substrate 1 of FIG. 1. The interlayer insulating film ILD3 is a film made of silicon oxide and formed (deposited) by, for example, a CVD (Chemical Vapor Deposition) method. Then, above the semiconductor substrate 1 (not illustrated) in which the contact plug WLC (see FIG. 2) for the word line penetrating through the interlayer insulating film ILD3 is formed, a tungsten film 2*a* which becomes the word line, the amorphous silicon layer 40*a* to which the p-type impurity is doped at a high concentration, amorphous silicon layers 51*a* and 52*a* to which any impurity is not doped, and an amorphous silicon layer 60*a* to which the n-type impurity is doped are sequentially formed by the CVD method. Note that the amorphous silicon layers 51*a* and 52*a* are films formed for preventing the generation of the leakage current in the application of the reverse-bias voltage in the PIN-type polysilicon diode, which will be formed later. However, in order to easily carrying the current in the application of the forward-bias voltage, the p-type impurity may be doped at a concentration, for example, much lower than that of the amorphous silicon layer 40*a*.

Figure 10:
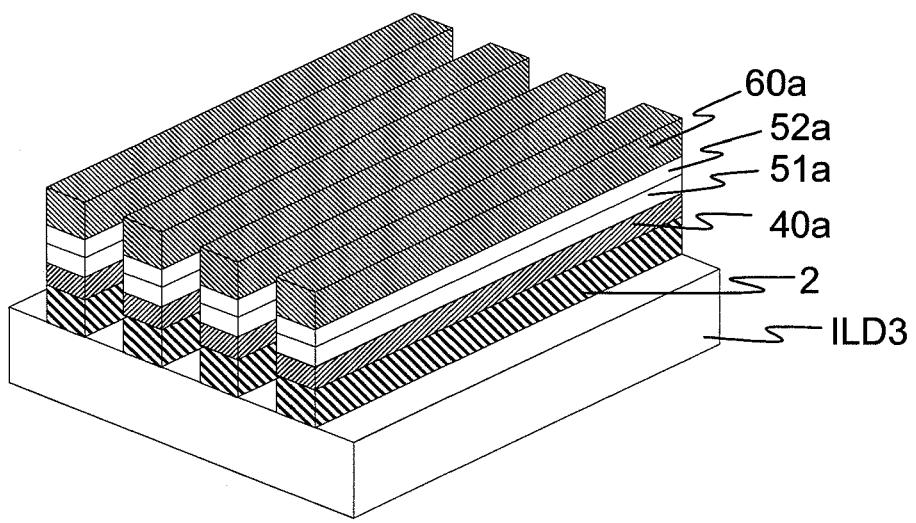
FIG. 10 is an overhead view explaining the manufacturing method of the nonvolatile semiconductor memory device, continued from FIG. 9.

Next, as illustrated in FIG. 10, the tungsten film 2*a*, the amorphous silicon layers 40*a*, 51*a*, 52*a*, and 60*a* are patterned in a stripe shape extending in the word-line direction. That is, by a dry etching method with using a photolithography technique, the tungsten film 2*a* and the amorphous silicon layers 40*a*, 51*a*, 52*a*, and 60*a* are patterned in the stripe shape in the direction along the main surface of the semiconductor substrate to expose an upper surface of the interlayer insulating film ILD3, so that the word line 2 is formed of the tungsten film 2*a*. Here, the amorphous silicon layers 40*a*, 51*a*, 52*a*, and 60*a* and the word lines 2 are collectively processed in a self-alignment manner, and therefore, stacking misalignment is not caused among the layers of the word line 2 and the amorphous silicon layers 40*a*, 51*a*, 52*a*, and 60*a* in the word-line direction, and therefore, the reliability of the memory rewriting operation can be enhanced.

At this time, if a height of the layer including the amorphous silicon layers 51*a* and 52*a* is too high, a height of the stripe-shaped pattern including the amorphous silicon layers 40*a*, 51*a*, 52*a*, and 60*a*, and the word line 2 is too high with respect to a width of the stripe-shaped pattern including: the amorphous silicon layers 40*a*, 51*a*, 52*a*, and 60*a*; and the word line 2 in a direction orthogonal to the extending direction of the word line 2 and along the main surface of the semiconductor substrate (not illustrated). That is, the aspect ratio of the stripe-shaped pattern becomes high. If the aspect ratio is too high, the stripe-shaped pattern is easily collapsed, and therefore, it is required to widely form the width of the stripe-shaped pattern in order to prevent the pattern collapse, and thus, the microfabrication of the nonvolatile semiconductor memory device is prevented. Therefore, it is desirable to form the height of the layer including the amorphous silicon layers 51*a* and 52*a* as low as possible.

Figure 11:
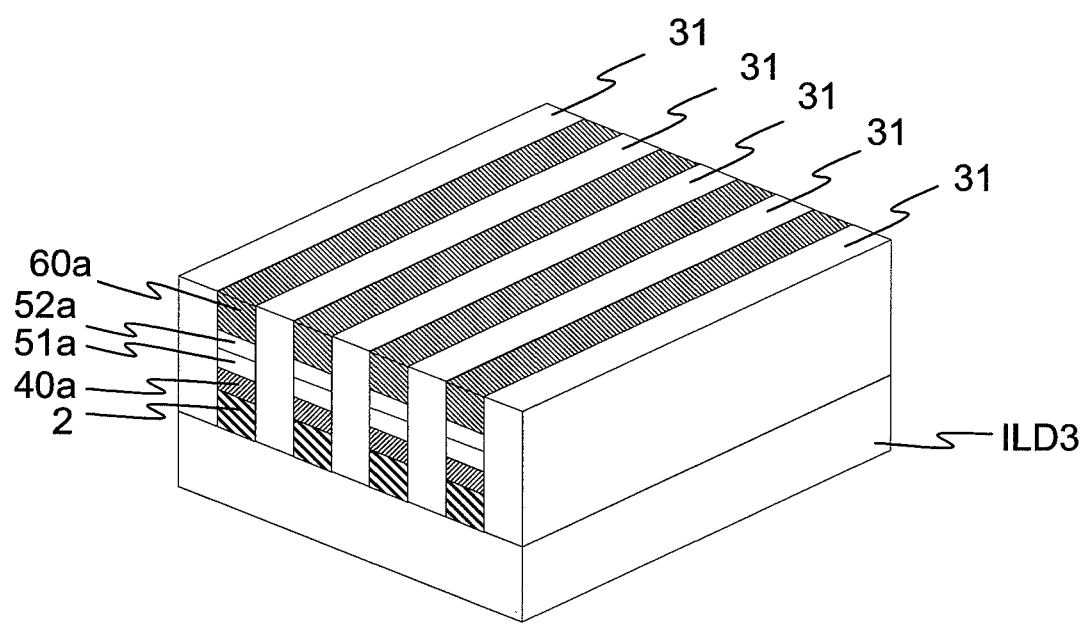
FIG. 11 is an overhead view explaining the manufacturing method of the nonvolatile semiconductor memory device, continued from FIG. 10.

Next, as illustrated in FIG. 11, a space between the layers including the amorphous silicon layers 40*a*, 51*a*, 52*a*, and 60*a* arranged in the stripe shape and between the word lines 2 is buried by, for example, the insulating layer 31 made of silicon oxide, and then, the space is flattened by a chemical mechanical polishing (CMP) method to expose an upper surface of the amorphous silicon layer 60*a*.

Figure 12:
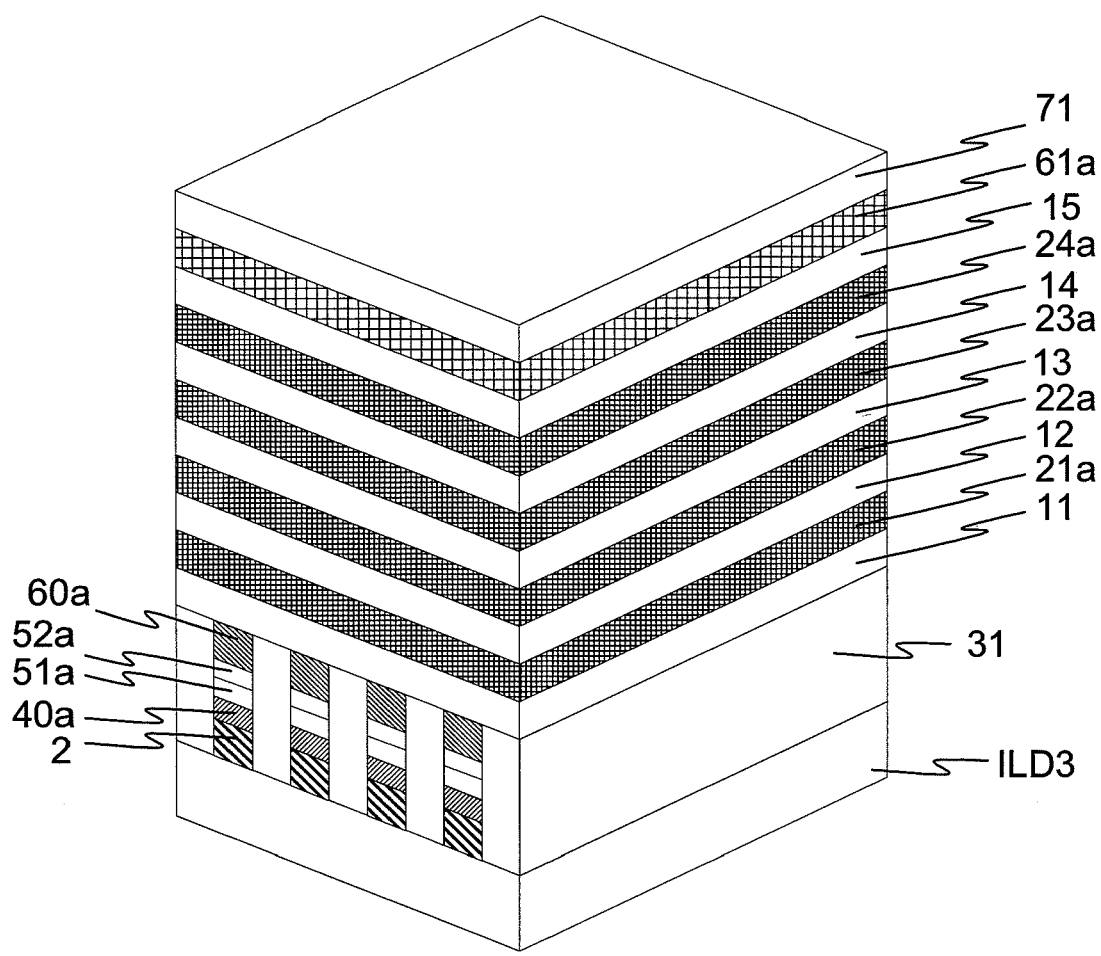
FIG. 12 is an overhead view explaining the manufacturing method of the nonvolatile semiconductor memory device, continued from FIG. 11.

Next, as illustrated in FIG. 12, an insulating layer 11, an amorphous silicon layer 21*a*, an insulating layer 12, an amorphous silicon layer 22*a*, an insulating layer 13, an amorphous silicon layer 23*a*, an insulating layer 14, an amorphous silicon layer 24*a*, an insulating layer 15, an amorphous layer 61*a*, and an insulating layer 71 are sequentially formed above the insulating layer 31 and the amorphous silicon layer 60*a*.

Figure 13:
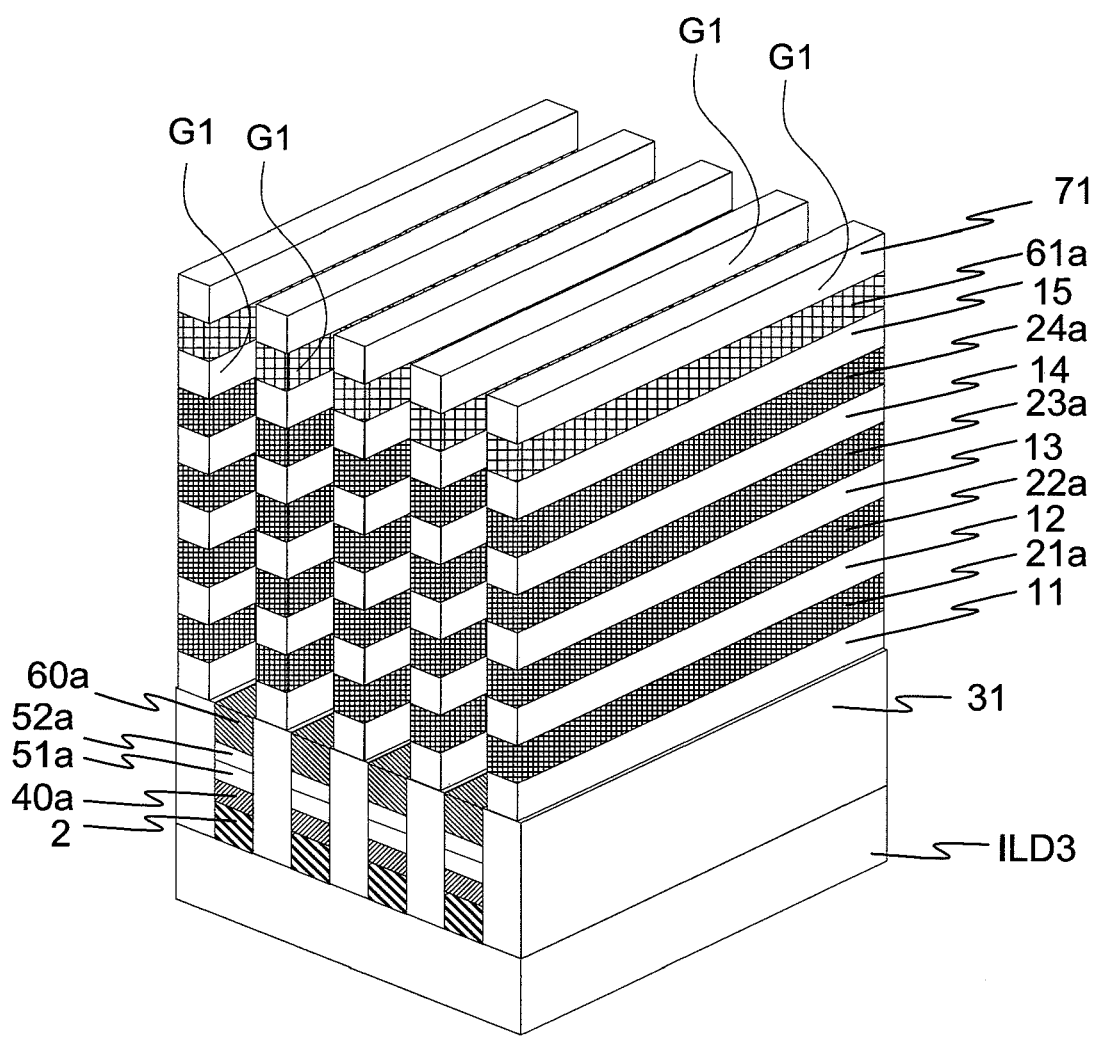
FIG. 13 is an overhead view explaining the manufacturing method of the nonvolatile semiconductor memory device, continued from FIG. 12.

Next, as illustrated in FIG. 13, the insulating layer 11, the amorphous silicon layer 21*a*, the insulating layer 12, the amorphous silicon layer 22*a*, the insulating layer 13, the amorphous silicon layer 23*a*, the insulating layer 14, the amorphous silicon layer 24*a*, the insulating layer 15, the amorphous layer 61*a*, and the insulating layer 71, which are formed in FIG. 12, are processed in a stripe shape parallel to the extending direction of the word line 2 by using the dry etching method with using the photolithography technique. In this manner, the stripe-shaped trench G1 reaching the amorphous silicon layer 60*a* is formed in the insulating layer 11, the amorphous silicon layer 21*a*, the insulating layer 12, the amorphous silicon layer 22*a*, the insulating layer 13, the amorphous silicon layer 23*a*, the insulating layer 14, the amorphous silicon layer 24*a*, the insulating layer 15, the amorphous layer 61*a*, and the insulating layer 71. At this time, a space portion between the stripe-shaped stacked films each including: the insulating layer 11; the amorphous silicon layer 21*a*; the insulating layer 12; the amorphous silicon layer 22*a*; the insulating layer 13; the amorphous silicon layer 23*a*; the insulating layer 14; the amorphous silicon layer 24*a*; the insulating layer 15; the amorphous layer 61*a*; and the insulating layer 71 is arranged right above the word line 2. That is, here, the upper surface of the amorphous silicon layer 60*a* is exposed, so that the insulating layer 11, the amorphous silicon layer 21*a*, the insulating layer 12, the amorphous silicon layer 22*a*, the insulating layer 13, the amorphous silicon layer 23*a*, the insulating layer 14, the amorphous silicon layer 24*a*, the insulating layer 15, the amorphous layer 61*a*, and the insulating layer 71 remains above the insulating layer 31.

Figure 14:
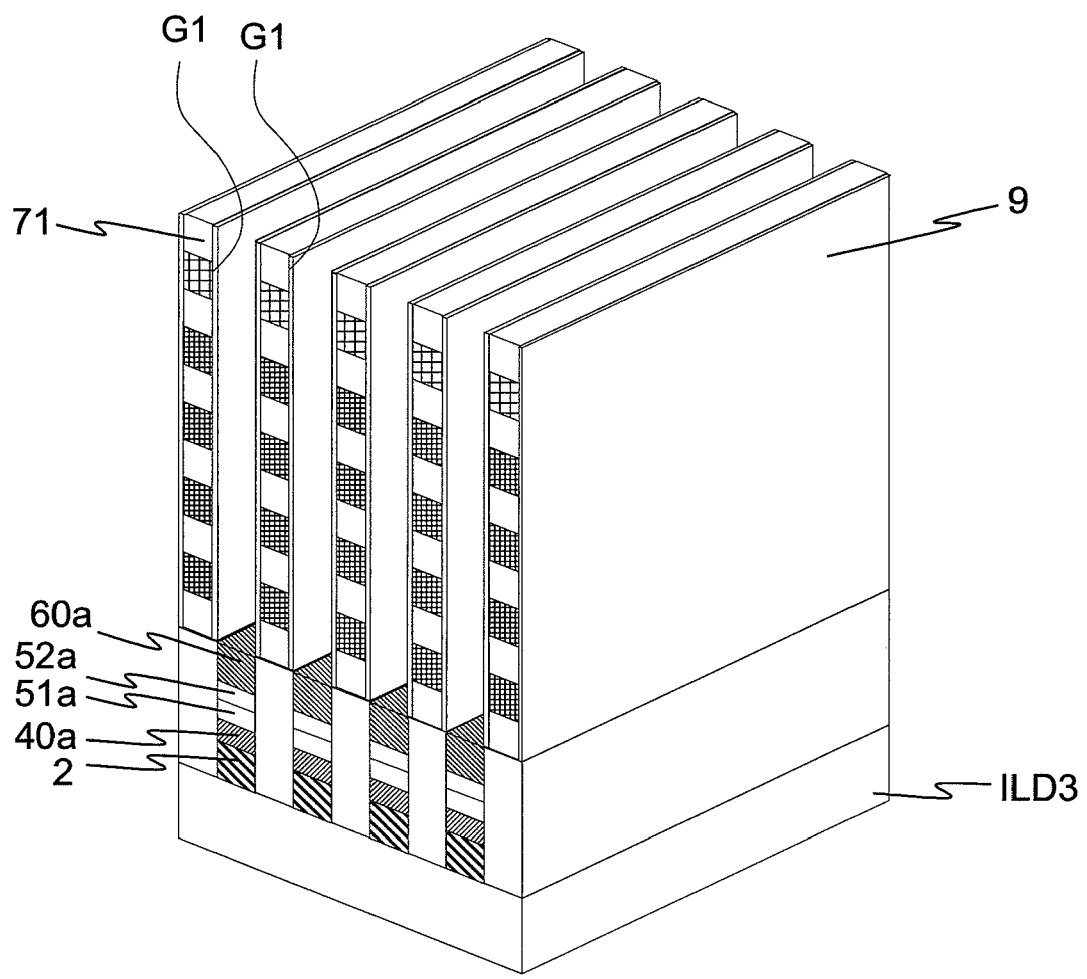
FIG. 14 is an overhead view explaining the manufacturing method of the nonvolatile semiconductor memory device, continued from FIG. 13.

Next, as illustrated in FIG. 14, a thin gate insulating layer 9 is formed by, for example, the CVD method above the insulating layer 71 and on the inner wall and bottom surface of the trench G1 so that the inside of the trench G1 is not completely buried, and then, the gate insulating layer 9 above the insulating layer 71 and the gate insulating layer 9 above the amorphous silicon layer 60*a* are removed by etch back. In this manner, the gate insulating layer 9 is formed on the inner wall of the trench G1.

Figure 15:
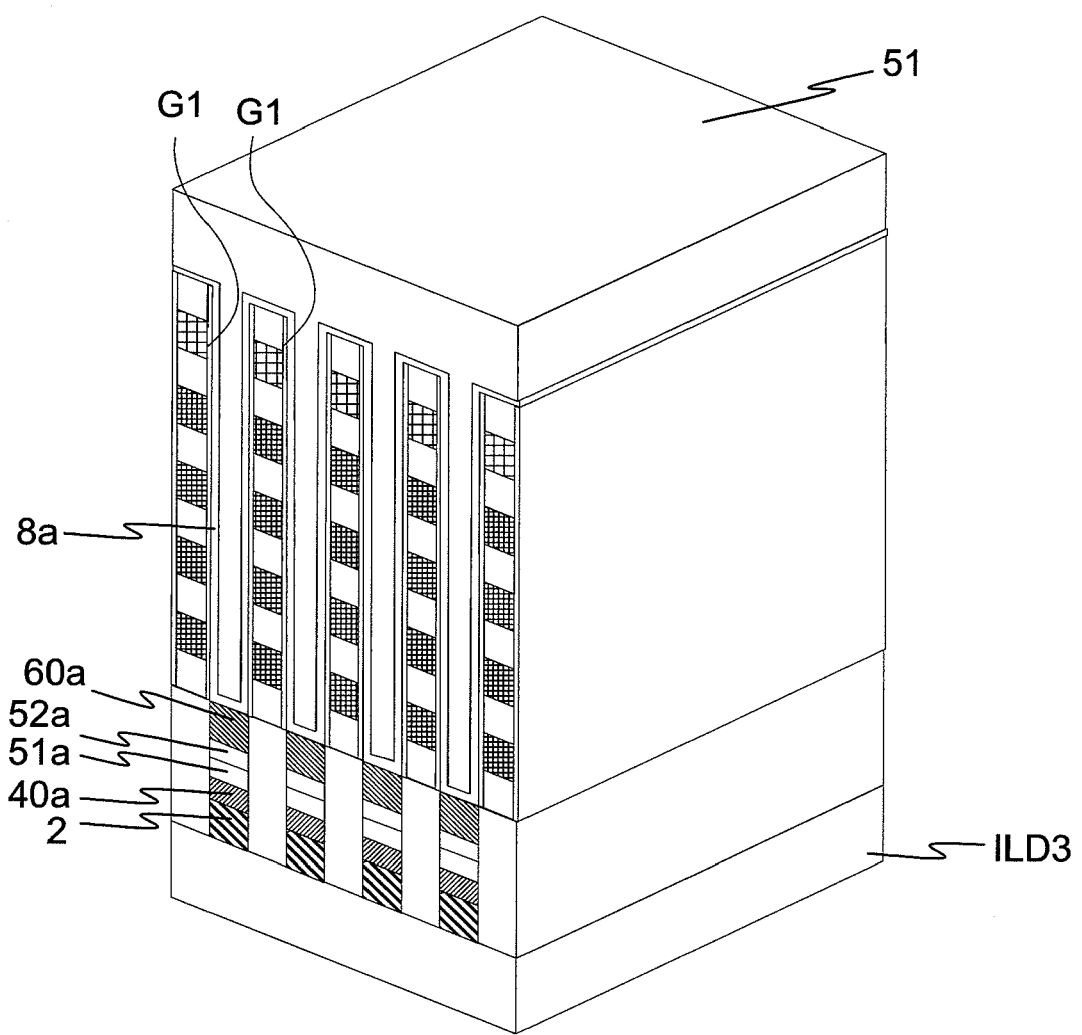
FIG. 15 is an overhead view explaining the manufacturing method of the nonvolatile semiconductor memory device, continued from FIG. 14.

Next, as illustrated in FIG. 15, an insulating layer 51 and an amorphous silicon layer 8*a* which becomes a polysilicon layer are formed. the amorphous silicon layer 8*a* is formed by the CVD method on a surface of the gate insulating layer 9 and above the amorphous silicon layer 60*a* and the insulating layer 71 so that the inside of the trench G1 is not completely buried, and the insulating layer 51 is formed above the amorphous silicon layer 8*a* so as to completely bury the inside of the trench G1.

Figure 16:
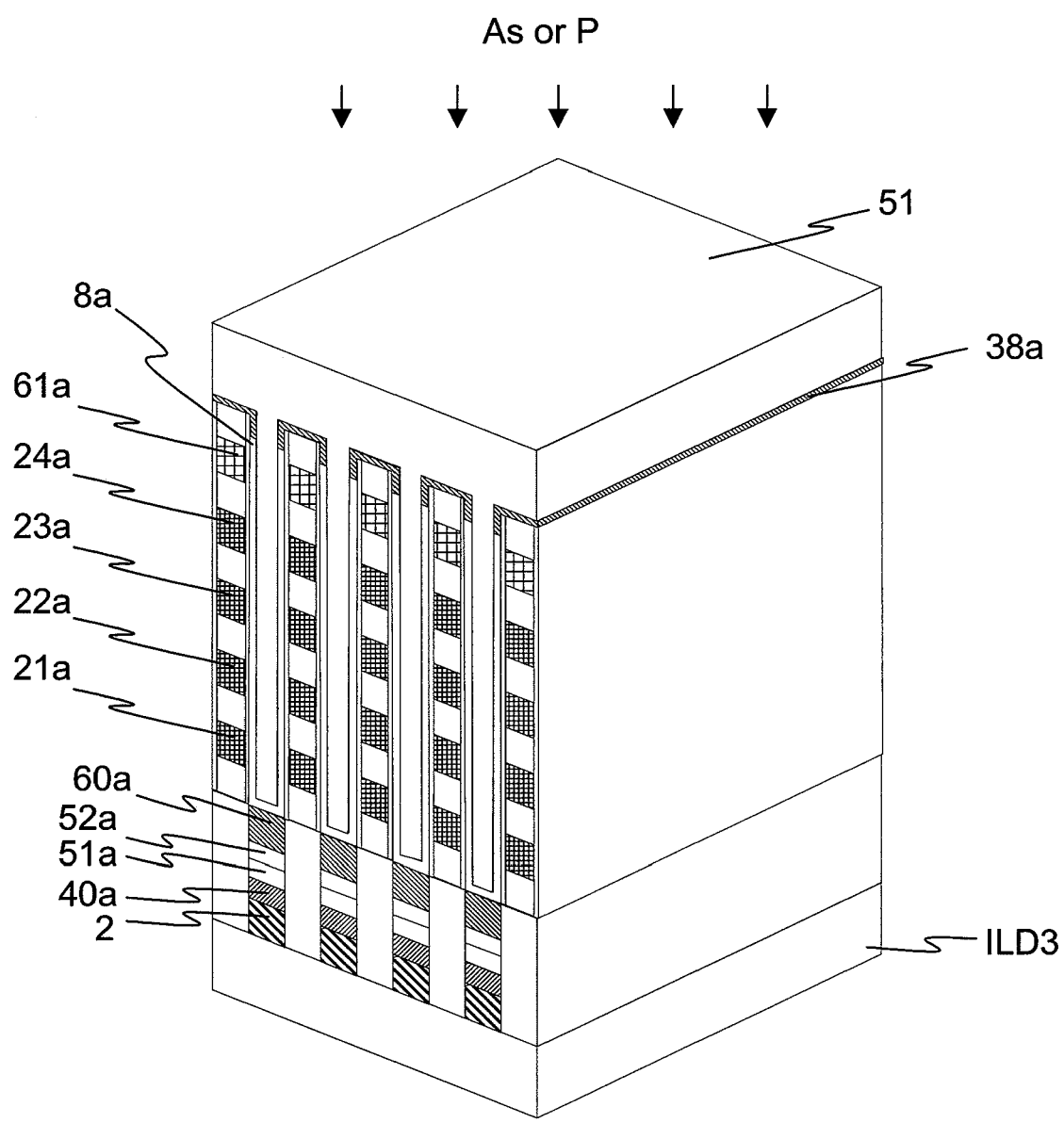
FIG. 16 is an overhead view explaining the manufacturing method of the nonvolatile semiconductor memory device, continued from FIG. 15.

Next, arsenic (As) or phosphorous (P) which is the n-type impurity is implanted from a direction of arrows illustrated in FIG. 16 toward the main surface of the semiconductor substrate (not illustrated) by ion implantation to dope arsenic (As) or phosphorous (P) to an upper portion of the amorphous silicon layer 8*a*. In this manner, an amorphous silicon layer 38*a* is formed in the upper portion of the amorphous silicon layer 8*a* to which arsenic (As) or phosphorous (P) is doped.

Here, As (arsenic) or P (phosphorous) is implanted so that they are not doped to the amorphous silicon layer 8a which is below an upper surface of the amorphous silicon layer 61a.

Figure 17:
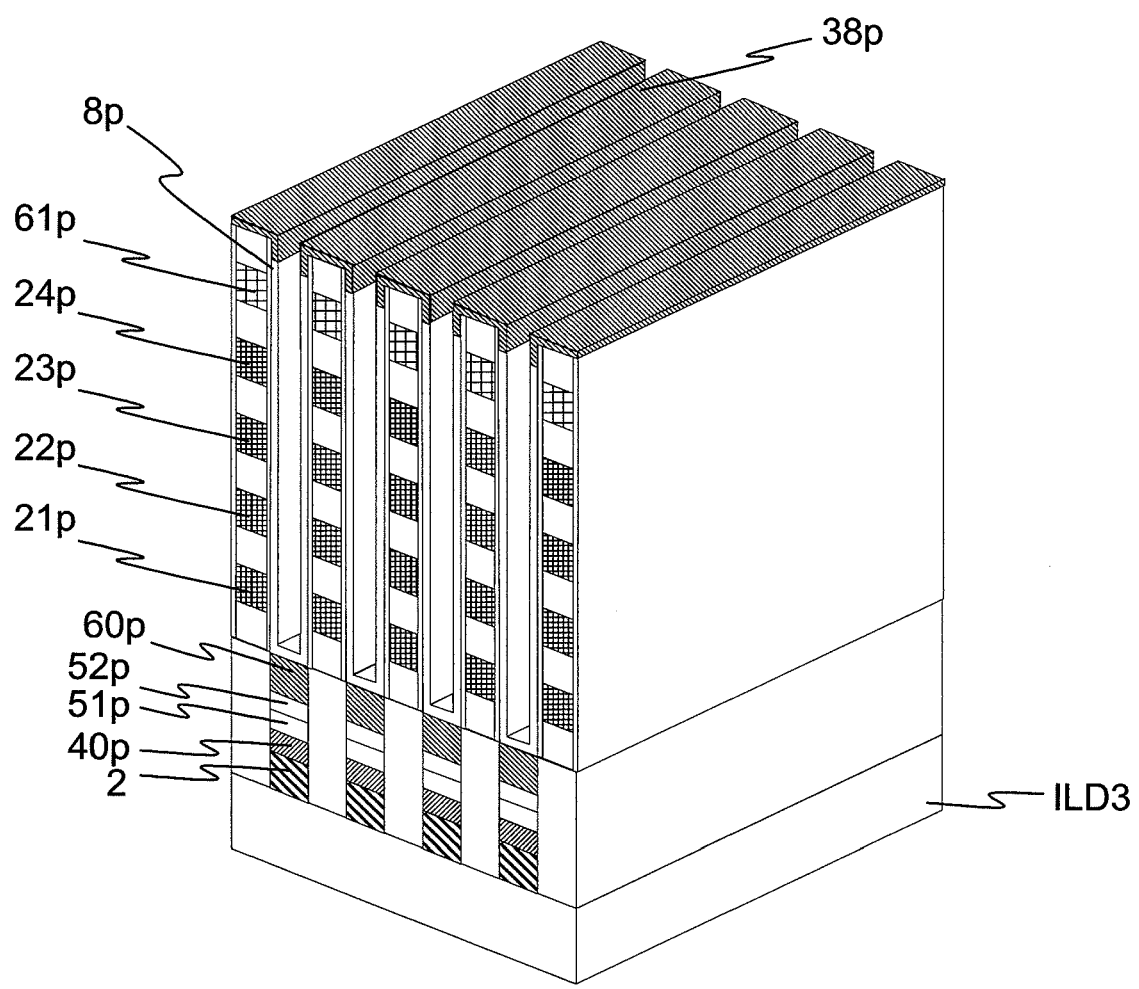
FIG. 17 is an overhead view explaining the manufacturing method of the nonvolatile semiconductor memory device, continued from FIG. 16.

Next, by thermal treatment, the amorphous silicon layers 40a, 51a, 52a, 60a, 8a, 38a, 21a, 22a, 23a, 24a, and 61a, which are illustrated in FIG. 16, are crystallized, and the impurities contained in the layers are activated, and then, the insulating layer 51 is removed by, for example, a wet etching method. The amorphous silicon layers 40a, 51a, 52a, 60a, 8a, 38a, 21a, 22a, 23a, 24a, and 61a are changed to polysilicon layers 40p, 51p, 52p, 60p, 8p, 38p, 21p, 22p, 23p, 24p, and 61p by the thermal treatment, respectively, so that a structure illustrated in FIG. 17 is obtained.

As the thermal treatment performed here, a method of using RTA (Rapid Thermal Annealing) with a lamp or others is conceivable. However, the annealing time of the RTA is long as several seconds or longer, and therefore, the p-type impurity contained in the amorphous silicon layer 40a and the n-type impurity contained in the amorphous silicon layer 60a in FIG. 16 are diffused in the amorphous silicon layers 51a and 52a, and there is a possibility that the electric-field relaxation layer (I layer) is disappeared. Therefore, here, it is preferable to use laser annealing which allows the crystallization and the impurity activation in a short period of time.

Also, for the annealing, a long-wavelength laser such as $CO_2$ laser (wavelength: 10.64 μm) is preferable to a short-wavelength laser such as KrF (krypton fluoride) excimer laser (wavelength: 248 nm). If the short-wavelength laser such as KrF excimer laser is irradiated to the upper surface of the structure illustrated in FIG. 16, almost all of the energy of the laser is absorbed on slight surfaces of the amorphous silicon layers 8a and 38a. Therefore, if the KrF excimer laser is used, in order to crystallize the amorphous silicon layers in a region away from the surface such as the amorphous silicon layers 40a, 51a, 52a, and 60a in FIG. 16 and activate the impurities, the energy which melts the amorphous silicon layers 8a and 38a is required, and therefore, the impurities in the melted amorphous silicon are adversely diffused wider than those in the case of using the RTA. If the long-wavelength laser such as the $CO_2$ laser is irradiated to the upper surface of the structure illustrated in FIG. 16, the energy of the laser is absorbed on the whole layers such as the amorphous silicon layers 21a, 22a, 23a, 24a, 40a, 51a, 52a, and 60a, and therefore, it is prevented to locally increase a temperature of one portion and melt the portion, so that the amorphous silicon can be crystallized, and the impurities can be activated. Also, the annealing time (several hundred of micro seconds or shorter) of the laser annealing is shorter than that of the RTA, and therefore, the crystallization and the impurity activation can be performed with suppressing the impurity diffusion. As described above, the high-temperature and short-time thermal treatment can be performed by the laser annealing, and therefore, it can be prevented to damage the nonvolatile semiconductor memory device in manufacturing steps. Further, by not the annealing for each layer formation but the laser annealing after stacking the plurality of amorphous silicon layers, the thermal load applied to the nonvolatile semiconductor memory device in the manufacturing steps can be reduced, and the manufacturing cost can be reduced by reducing the steps of the thermal treatment.

Note that, here, after stacking the amorphous silicon layers 51a and 52a, the amorphous silicon layers 51a and 52a are crystallized by the annealing. At this time, the amorphous silicon layers 51a and 52a are not united to be one layer film, or the crystal boundaries of the respective crystals forming the polysilicon layers 51p and 52p (see FIG. 17) are not linearly connected and easily formed. This is because there is provided a step of taking out the semiconductor substrate (semiconductor wafer) from a manufacturing apparatus in each layer formation of the amorphous silicon layers and rinsing the semiconductor substrate, and therefore, an extremely-thin natural oxidation film is formed on an exposed surface of the amorphous silicon layer every time the semiconductor substrate is taken out from the apparatus. In this manner, the amorphous silicon layers 51a and 52a are crystallized without being united or affecting the grain boundaries of each other in the crystallization by the annealing, and therefore, a possibility that the crystal grain boundaries of the respective layers are linearly connected in the film-thickness direction is low.

Figure 18:
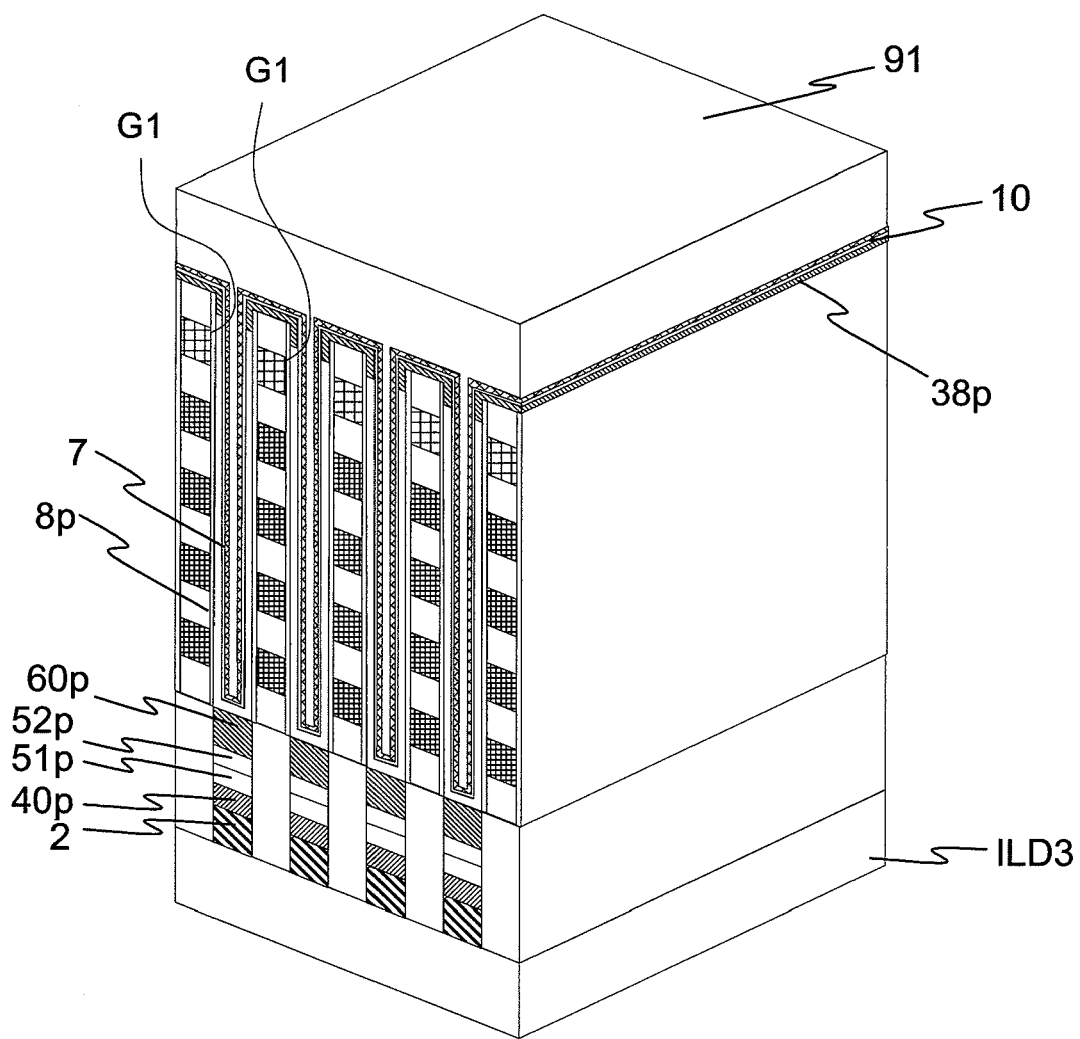
FIG. 18 is an overhead view explaining the manufacturing method of the nonvolatile semiconductor memory device, continued from FIG. 17.

Next, as illustrated in FIG. 18, on the polysilicon layers 8p and 38p, the insulating layer 10 and the phase-change material layer 7 having a thickness of about 1 nm are sequentially formed by the CVD method so as not to completely bury the inside of the trench G1. Subsequently, an insulating layer 91 is formed above the phase-change material layer 7 by the CVD method so as to completely bury the inside of the trench G1.

Figure 19:
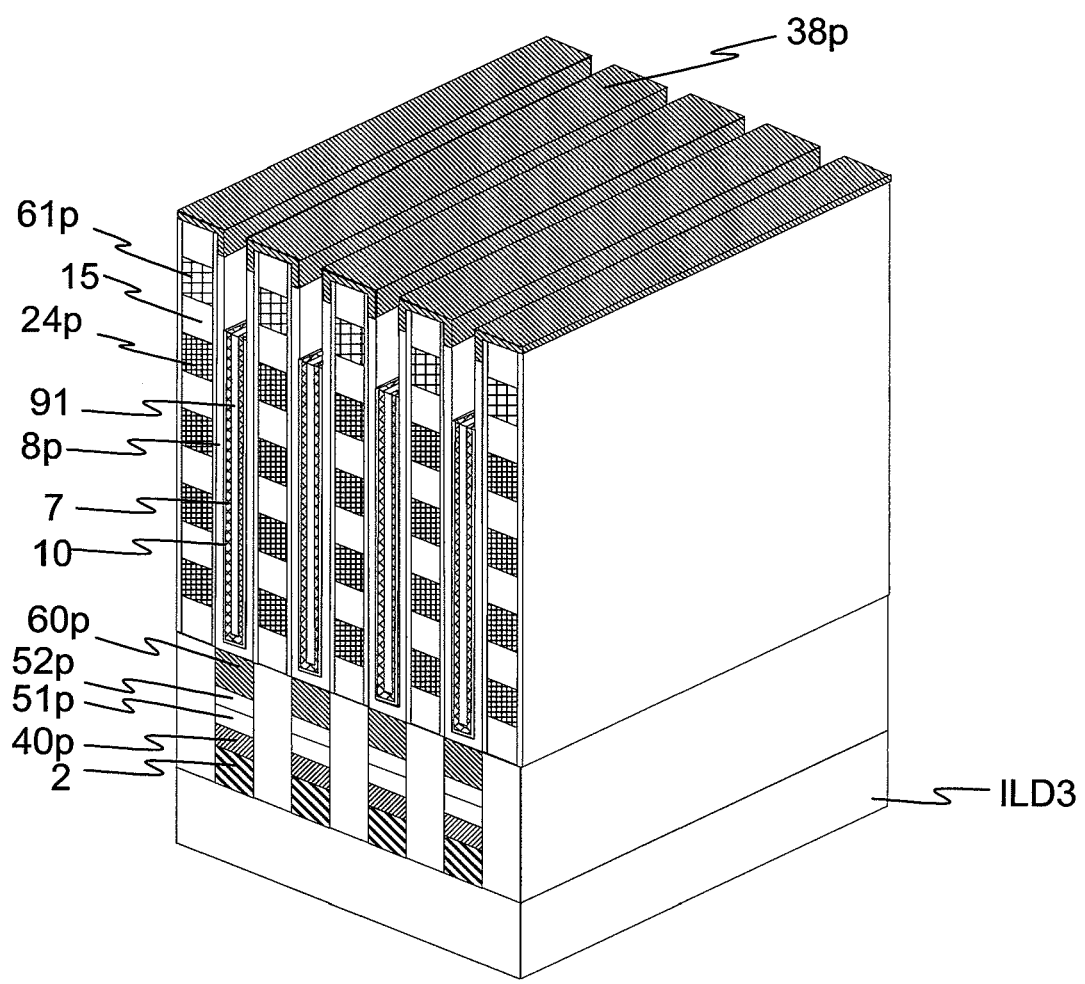
FIG. 19 is an overhead view explaining the manufacturing method of the nonvolatile semiconductor memory device, continued from FIG. 18.

Next, as illustrated in FIG. 19, etch back is performed so that a height of an uppermost surface of each of the phase-change material layer 7 and the insulating layers 10 and 91 is lower than a height of an upper surface of the insulating layer 15 and higher than a height of a lower surface of the insulating layer 15. A reason of setting the height of the uppermost surface of the phase-change material layer 7 to be lower than the height of the upper surface of the insulating layer 15 is to prevent a current flow between the bit line and the word line which are the source and drain via the phase-change material layer 7 when the gate of the gate polysilicon layer 61p is OFF. Also, a reason of setting the height of the uppermost surface of the phase-change material layer 7 to be higher than the height of the lower surface of the insulating layer 15 is to generate the current flow between the bit line and the word line which are the source and drain via the phase-change material layer 7 when the gate of the gate polysilicon layer 24p formed below the insulating layer 15 is OFF.

Figure 20:
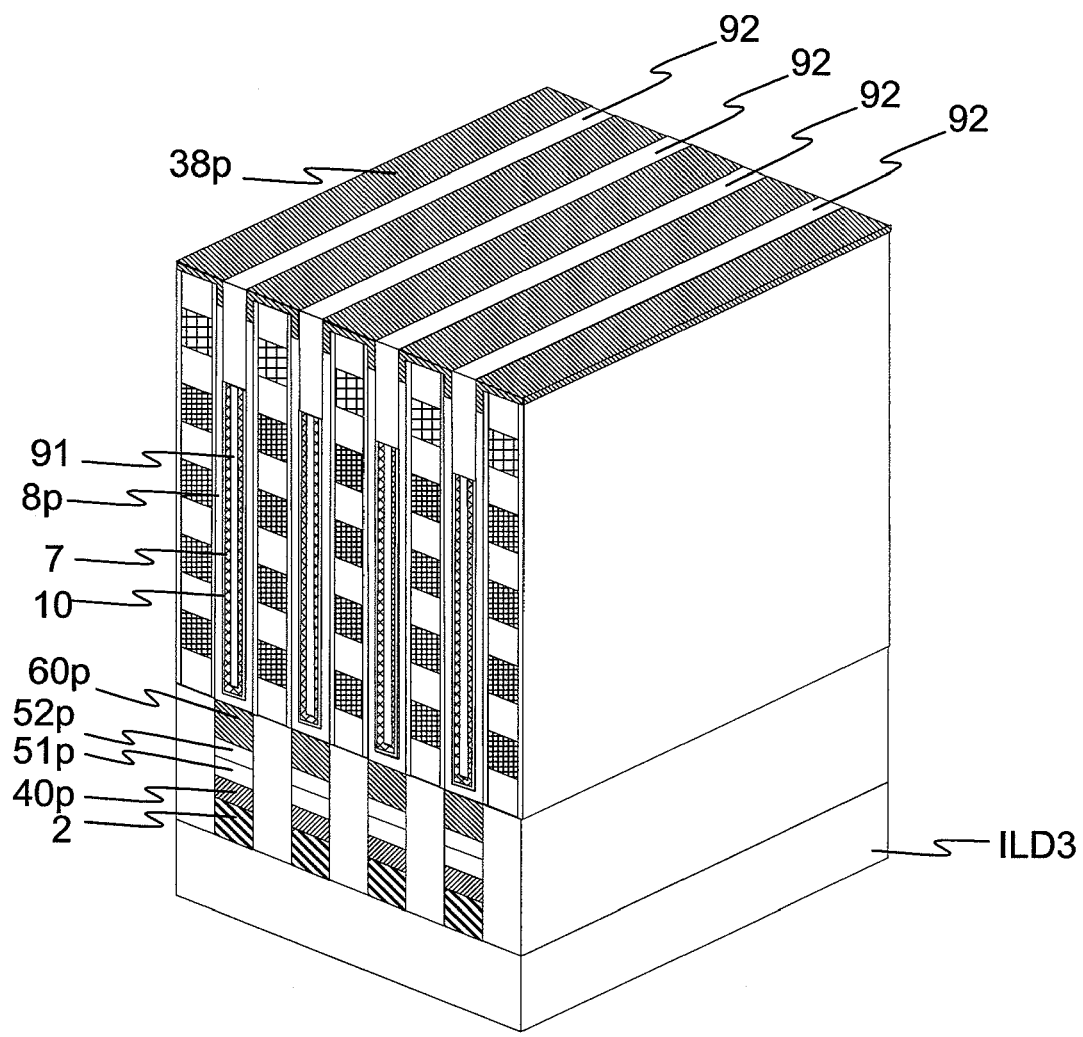
FIG. 20 is an overhead view explaining the manufacturing method of the nonvolatile semiconductor memory device, continued from FIG. 19.

Next, as illustrated in FIG. 20, an insulating layer 92 is formed on the phase-change material layer 7 and the polysilicon layer 38p to bury the inside of the trench G1 on the phase-change material layer 7 by the insulating layer 92, and then, an upper surface of the polysilicon layer 38p is exposed by etch back.

Then, the contact plug BLC (see FIG. 2) connecting between the bit line and the peripheral circuit formed above the semiconductor substrate is formed.

Figure 21:
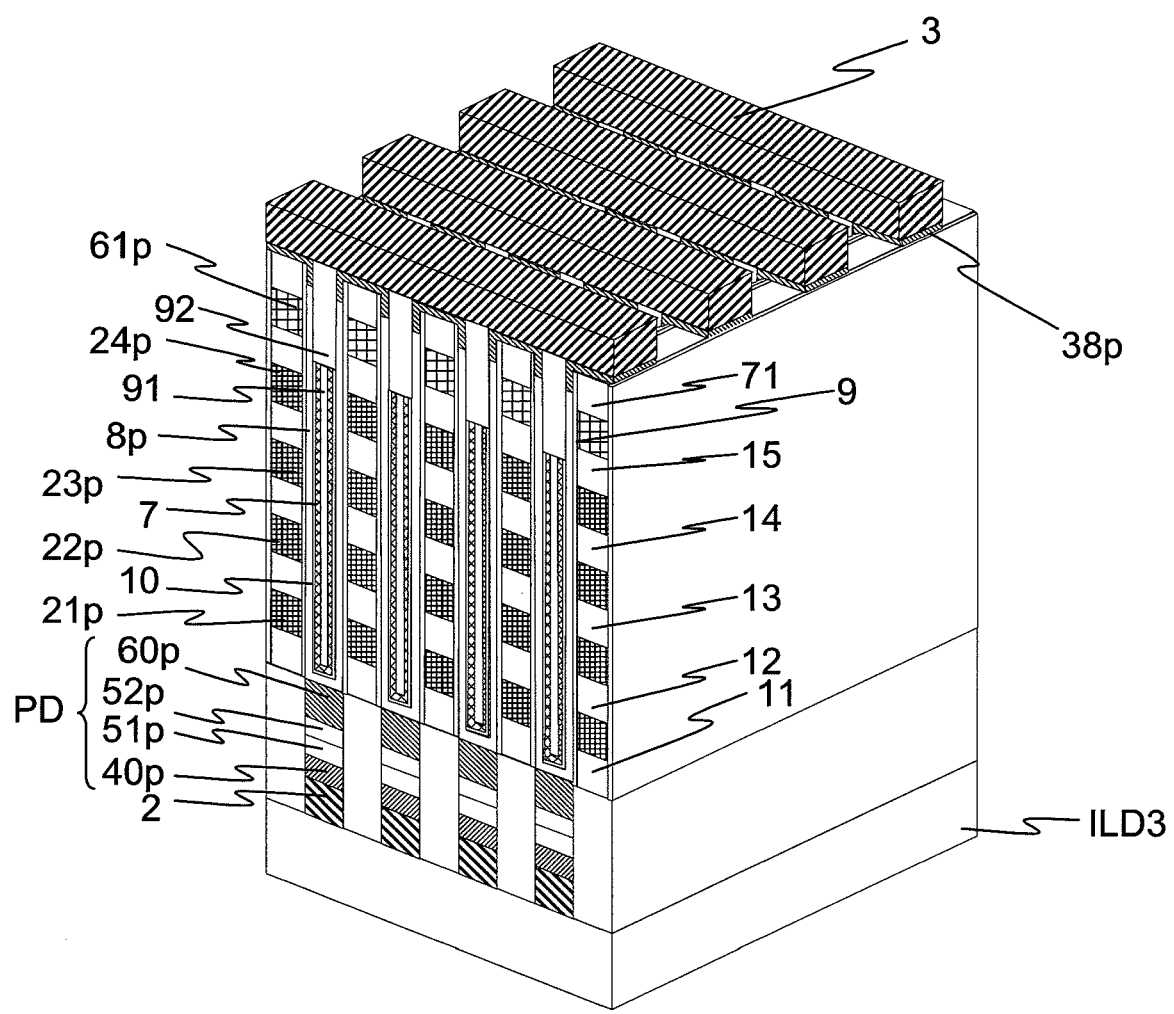
FIG. 21 is an overhead view explaining the manufacturing method of the nonvolatile semiconductor memory device, continued from FIG. 20.

Next, as illustrated in FIG. 21, a metal film is formed above the polysilicon layer 38p and the insulating layer 92 by, for example, a sputtering method, and then, the metal film is processed in a stripe shape by a dry etching method with using a photolithography technique to form the bit line 3 orthogonal to the word line 2 and extending in the stripe shape in the direction along the main surface of the semiconductor substrate. Then, the n-type polysilicon layer 38p, the insulating layer 92, the polysilicon layer 8p, the insulating layer 10, the phase-change material layer 7, the insulating layer 91, and the polysilicon layers 60p, 51p, 52p, and 40p, which are below the stripe-shaped region in which the metal film is removed, are removed by selective etching. At this time, the gate polysilicon layers 21p, 22p, 23p, 24p, and 61p, the insulating layers 11, 12, 13, 14, 15, and 71, and the gate insulating layer 9, which are below the stripe-shaped region in which the metal film is removed, remain without being processed. However, the polysilicon layers 8p and 38p, the phase-change material layer 7, and the insulating layer 10 are removed.

Figure 22:
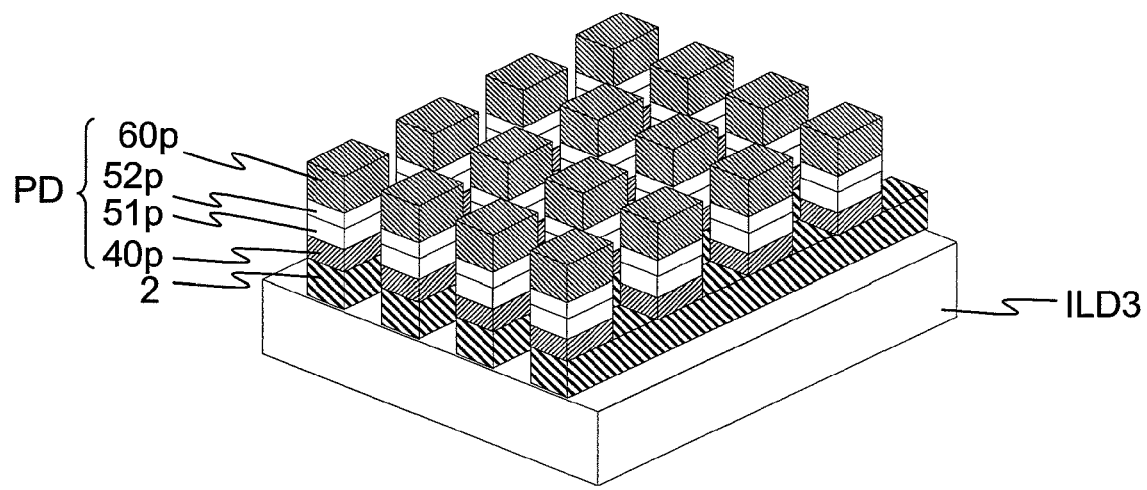
FIG. 22 is another overhead view illustrating the manufacturing method of the nonvolatile semiconductor memory device according to the first embodiment of the present invention.

Also, the polysilicon layers 60p, 51p, 52p, and 40p, which are above the word line 2, are also collectively removed at the same time with the above-described stripe processing to expose an upper surfaces of the word line 2. In this manner, the polysilicon layers 60p, 51p, 52p, and 40p are shaped in a plurality of columns arranged in a matrix shape above the word lines 2 as illustrated in FIG. 22, and the polysilicon diodes PD each formed of the polysilicon layers 60p, 51p, 52p, and 40p are formed as illustrated in FIG. 21. The polysilicon diodes PD are formed in the self alignment with respect to both the word lines 2 and the bit lines 3.

Figure 23:
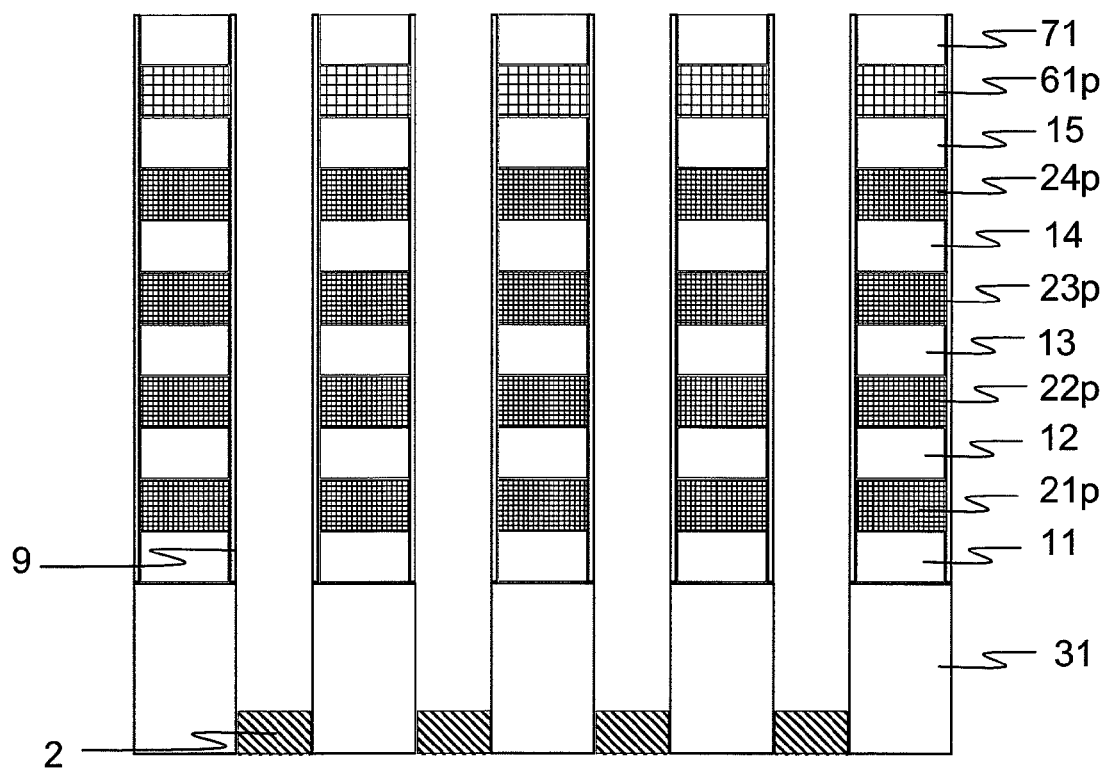
FIG. 23 is a cross-sectional view illustrating the manufacturing method of the nonvolatile semiconductor memory device according to the first embodiment of the present invention.

Here, in the structure illustrated in FIG. 21, a cross-sectional surface of a plane along the region between the bit lines 3 arranged in the stripe shape and vertical to the main surface of the semiconductor substrate is illustrated in FIG. 23.

Also, as illustrated in FIG. 21, the pattern of the polysilicon layer 8p, the phase-change material layer 7, and the insulating layer 10 of the vertical-type chain memory is formed in the self alignment with respect to the bit line 3. In this case, the plurality of layers are collectively processed after stacking the plurality of layers, and therefore, the misalignment in the stacking of layers can be prevented compared with the case of sequentially forming layers each having a specific shape one by one, and thus, the reliability of the memory rewriting operation can be enhanced. Further, by collectively processing a region from the bit line 3 to the upper surface of the word line 2, the polysilicon diode PD (see FIG. 22) can be also formed in a self alignment with respect to the bit line 3. The number of masks for processing can be reduced by collectively processing the plurality of layers as described above, and therefore, the manufacturing cost can be reduced.

While the illustration for subsequent steps is omitted, the insulating layer 33 (see FIG. 5) is formed in a space between the polysilicon diodes PD formed by the processing described in FIG. 21 and above the exposed word line 2 to bury spaces between the insulating layers 31 and between the stacked films above the insulating layers 31 illustrated in FIG. 23 by the insulating layer 33. Subsequently, the gate polysilicon at an end of the memory cell array is processed so as to form the contact plug for each layer as illustrated in FIG. 2, and the interlayer insulating film ILD5 is formed so as to cover the whole region including the memory cell array illustrated in FIG. 21. Subsequently, the contact plugs GC1 to GC4 reaching the gate polysilicon layers 21p to 24p, the contact plugs STGC1 and STGC2 reaching the gate polysilicon layers 61p, the gate wires GL1 to GL4, STGL1, and STGL2, and the contact plugs (not illustrated) connecting between the gate wires and peripheral circuits are formed. Subsequently, after the interlayer insulating film ILD6 is formed above the interlayer insulating film ILD5, the contact plug GBLC connecting between the global bit line GBL and the peripheral circuit in a lower layer is formed, and the global bit line GBL is formed above the contact plug GBLC and the interlayer insulating film ILD6, so that the nonvolatile semiconductor memory device having the vertical-type chain memories illustrated in FIGS. 1 and 2 is completed.

Figure 24:
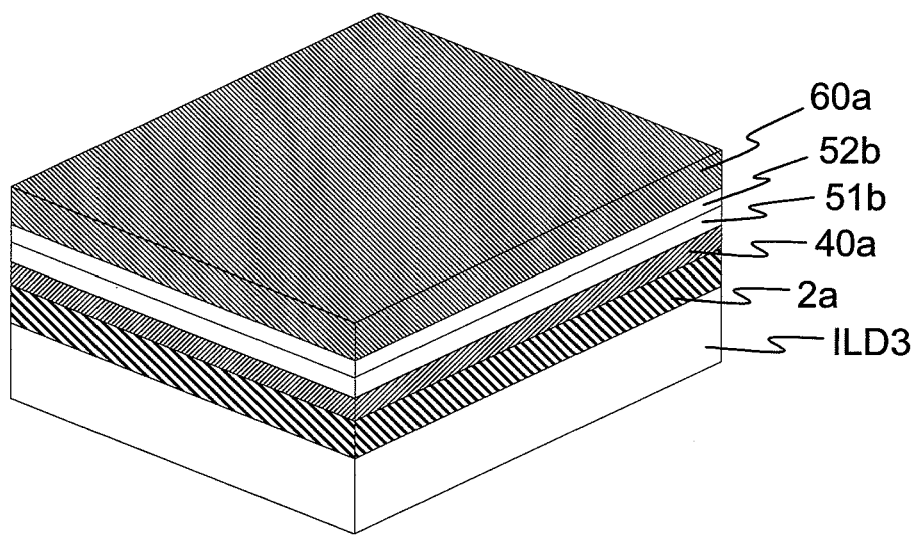
FIG. 24 is an overhead view of a nonvolatile semiconductor memory device in a manufacturing step illustrated as a comparison example.

In the present embodiment, as the method of forming 51p and 52p which are the electric-field relaxation layers of the polysilicon diodes illustrated in FIG. 1, the method of forming the two amorphous silicon layers 51a and 52a in the amorphous state as illustrated in FIG. 9 and changing them to be the polysilicon layers 51p and 52p by the crystallization annealing as illustrated in FIG. 17 is used. However, as illustrated in FIG. 24, a method of forming polysilicon layers 51b and 52b in the polysilicon state is also conceivable. Note that FIG. 24 is an overhead view illustrating a principal part of a nonvolatile semiconductor memory device in a manufacturing step corresponding to the step illustrated in FIG. 9.

Figure 25:
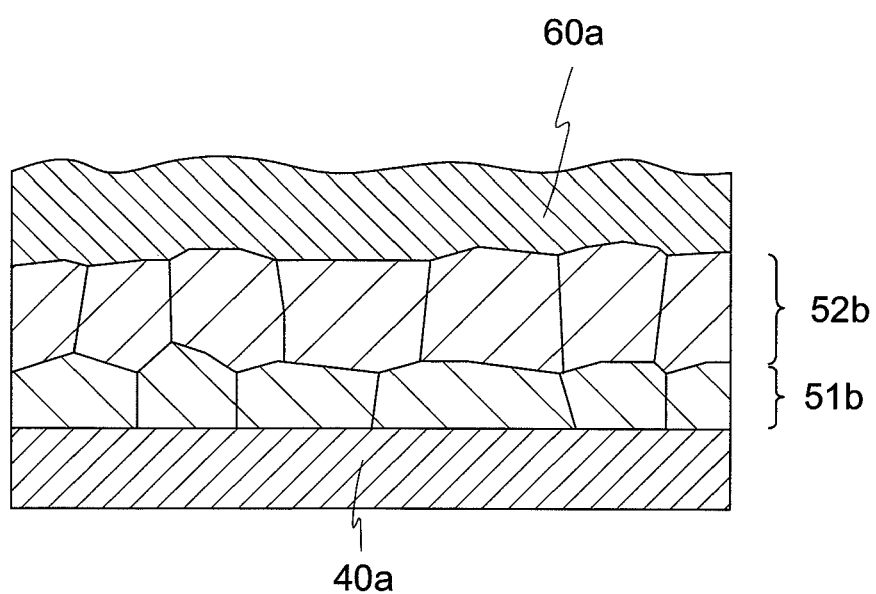
FIG. 25 is a cross-sectional view of a principal part of the nonvolatile semiconductor memory device in the manufacturing step illustrated as the comparison example.

However, if the polysilicon layers 51b and 52b are formed in the polysilicon state, each upper surface of the polysilicon layers 51b and 52b has a concave and convex shape affected by shapes of the crystal grains forming the polysilicon layers 51b and 52b at forming the polysilicon layers 51b and 52b as illustrated in FIG. 25. In this case, each upper surface of the polysilicon layers 51b and 52b and an upper surface of a film formed on an upper layer of them are not uniformly formed, and therefore, variations are caused in the performance of the nonvolatile semiconductor memory device, and the reliability thereof is lowered. Also, a polishing step or others is newly required in order to prevent this, and the manufacturing steps are complicated.

Figure 26:
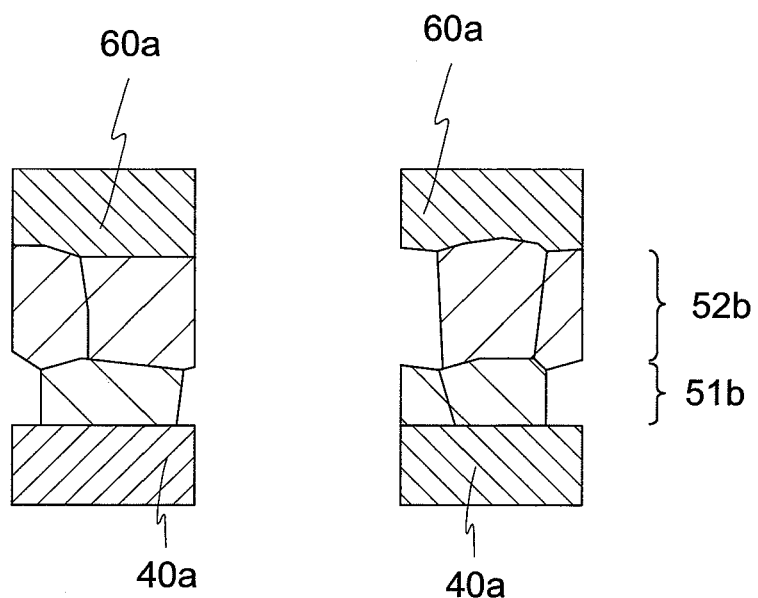
FIG. 26 is a cross-sectional view of a principal part of the nonvolatile semiconductor memory device illustrated as the comparison example.

Further, when the polysilicon layers 51b and 52b are formed in the polysilicon state, each crystal grain forming the polysilicon layers 51b and 52b becomes a clod at processing the polysilicon layers 51b and 52b by polishing or etching, and is easily detached from the polysilicon layers 51b and 52b, and therefore, each processed surface of the polysilicon layers 51b and 52b tends to have a concave and convex shape as chipped off as illustrated in FIG. 26. In this case, variations are caused in the performance of the polysilicon diode, and the reliability of the nonvolatile semiconductor memory device is lowered.

On the other hand, when the amorphous silicon layers are changed to be the polysilicon layers by the thermal treatment after the amorphous silicon layers are formed as described in the present embodiment, the amorphous silicon layer wholly has the uniform upper-surface height at the formation, and the layer is changed to be the polysilicon layer as maintaining the uniform upper surface even after the crystallization annealing, and therefore, the upper surface of the electric-field relaxation layer of the polysilicon diode does not tend to have the concave and convex shape. Also, the polysilicon layer changed from the amorphous silicon state to the polysilicon state by the crystallization annealing can be easily processed by the polishing or the etching, and therefore, the possibility that each crystal grain forming the polysilicon layers is detached as the clod as described above is low. Therefore, as illustrated in FIG. 1, in the polysilicon layers 51p and 52p formed in the present embodiment, a sidewall having a uniform shape along an end surface of the mask in the upper layers can be formed at the processing by etching.

Figure 27:
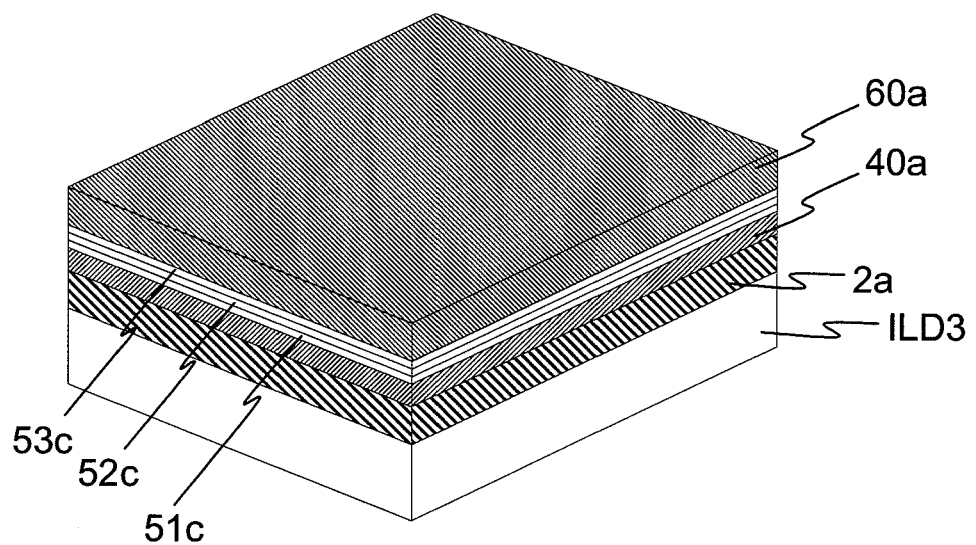
FIG. 27 is an overhead view illustrating another manufacturing method of the nonvolatile semiconductor memory device according to the first embodiment of the present invention.

Further, the low-concentration impurity layer (I layer) which is the electric-field relaxation layer is not limited as two layers, and may be formed by the crystallization annealing after stacking three or more amorphous silicon layers such as amorphous silicon layers 51c, 52c, and 53c in FIG. 27. As the thermal treatment performed here, the method of using the RTA as described above is cited. However, it is preferable to use the laser annealing which allows the crystallization and the impurity activation as suppressing the impurity diffusion.

Note that, in the present embodiment, the example in which the four gate polysilicon layers 21p to 24p are stacked as illustrated in FIG. 1 is described. However, the number of the layers is not limited to four, and the number of the stacked layers can be arbitrarily determined.

Figure 28A:
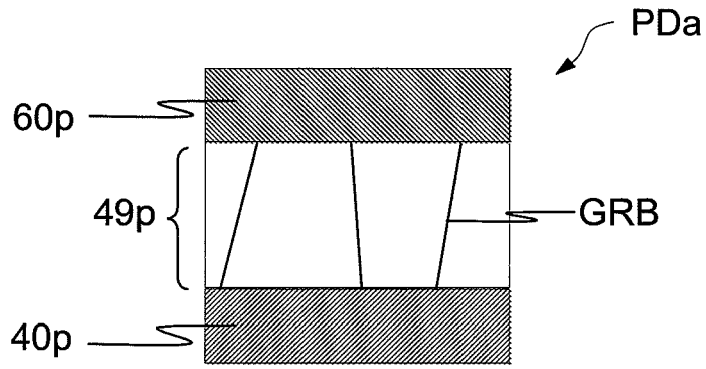
FIG. 28A is a cross-sectional view of a principal part of a nonvolatile semiconductor memory device illustrated as a comparison example.

Next, the effects of the present invention are described with reference to FIGS. 28A to FIG. 29. As a comparison example, FIG. 28A illustrates a polysilicon diode PDa which is a selective element used in a nonvolatile semiconductor memory device having a memory and a selective element. In the polysilicon diode PDa which is the PIN-type diode, as a polysilicon layer 49p having a low impurity concentration which plays a role of relaxing the electric field caused in the application of the reverse-bias voltage to suppress the OFF current, the polysilicon layer 49p is formed of a single layer instead of a plurality of stacked layers. Therefore, a thoroughly-penetrating crystal grain boundary GRB extending from a polysilicon layer 60p which is the n-type impurity layer to a polysilicon layer 40p which is the p-type impurity layer exists. Such a thin polysilicon layer 49p tends to be grown in a height direction of the polysilicon diode PDa (direction connecting between the polysilicon layer 60p and the polysilicon layer 40p), and the crystal grain boundary GRB tends to be linearly formed so as to connect between the polysilicon layer 60p and the polysilicon layer 40p. Normally, electrons tend to pass through the crystal grain boundary GRB. Therefore, if the crystal grain boundary GRB linearly penetrates through the polysilicon layer 60p and the polysilicon layer 40p, a conductive path for the electrons having a short distance is formed between the polysilicon layer 60p and the polysilicon layer 40p, and therefore, a leakage current tends to flow therethrough. Therefore, the OFF current in the application of the reverse-bias voltage is increased in the polysilicon diode PDa, and therefore, there is a problem that the reliability of the nonvolatile semiconductor memory device is lowered in the polysilicon diode PDa described as the comparison example.

Figure 28B:
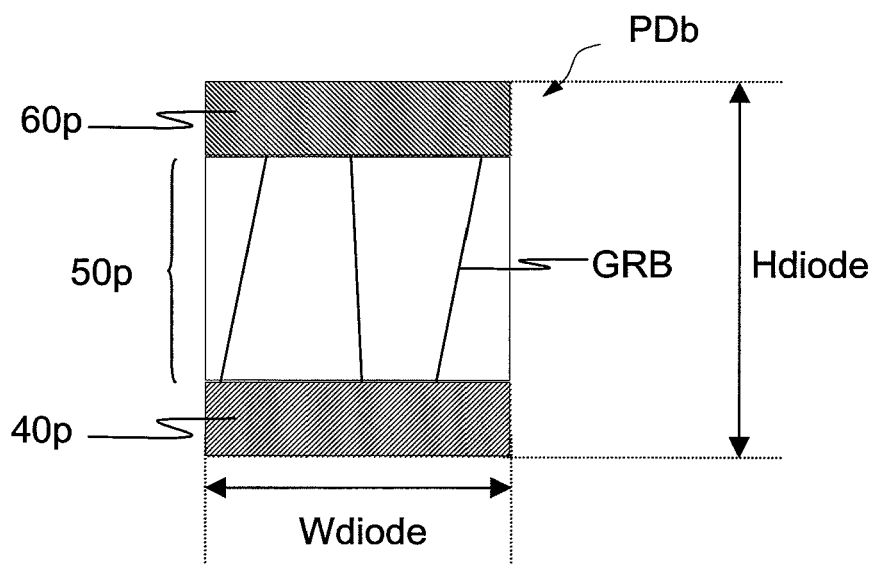
FIG. 28B is a cross-sectional view of a principal part of another nonvolatile semiconductor memory device illustrated as a comparison example.

On the other hand, as illustrated in FIG. 28B as another comparison example, a method of preventing the generation of the leakage current is conceivable, in which a polysilicon layer 50p whose film thickness is thicker than that of the polysilicon layer 49p illustrated in FIG. 28A is formed to extend a distance of the crystal grain boundary GRB between the polysilicon layer 40p and the polysilicon layer 60p. That is, in FIG. 28B, since the film thickness of the polysilicon layer 50p is thick, a height "Hdiode" of a polysilicon diode PDb in a direction vertical to the main surface of the semiconductor substrate (not illustrated) is long.

However, in FIG. 28B, a value of a width "Wdiode" of the polysilicon diode PDb in a direction along the main surface of the semiconductor substrate (not illustrated) is small with respect to the height Hdiode.

As illustrated in FIG. 29, an aspect ratio AR (=Hdiode/Wdiode) of a processable diode has a limit value. A vertical axis of a graph illustrated in FIG. 29 indicates the aspect ratio AR, and a horizontal axis thereof indicates a value of a processing rule (the width Wdiode of the diode) of the nonvolatile semiconductor memory device. As illustrated by a broken line, it is difficult to form a diode having a certain aspect ratio or higher, and the diode cannot be achieved. In the polysilicon diode PDb illustrated in FIG. 28B, since the height Hdiode of the diode is increased in order to prevent the leakage current, a value of the aspect ratio AR is increased, and the microfabrication reaches a limit at a comparatively large processing rule. That is, in the nonvolatile semiconductor memory device with using the polysilicon diode PDb illustrated in FIG. 28B, the microfabrication is difficult because of the problem due to the aspect ratio AR of the polysilicon diode PDb. In this case, for example, as the stripe-shaped pattern formed in the step described in FIG. 10, a pattern whose height is larger than a width of the pattern tends to be collapsed.

Figure 28C:
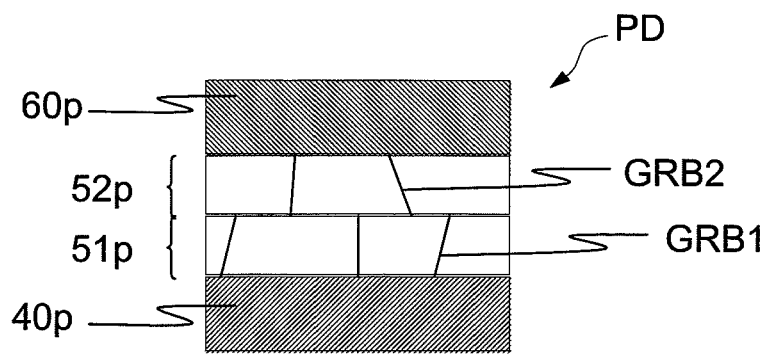
FIG. 28C is a cross-sectional view of a principal part of still another nonvolatile semiconductor memory device according to the first embodiment of the present invention.

Accordingly, FIG. 28C illustrates a polysilicon diode PD which is the selective element of the nonvolatile semiconductor memory device of the present embodiment. Here, the polysilicon layer having the low impurity concentration which plays the role of relaxing the electric field in the application of the reverse-bias voltage to suppress the OFF current has the structure of the plurality of stacked layers each including the polysilicon layers 51p and 52p. In a crystal grain boundary GRB1 of the polysilicon layer 51p and a crystal grain boundary GRB2 of 52p, the positional misalignment is caused as illustrated in FIG. 28C, and therefore, the formation of the thoroughly-penetrating crystal grain boundary extending from the polysilicon layer 60p to the polysilicon layer 40p can be prevented.

In this case, the electrons cannot linearly pass through the crystal grain boundaries between the polysilicon layer 60p and the polysilicon layer 40p, and therefore, the generation of the leakage current can be prevented. This is because, even when the electrons try to pass through the crystal grain boundary GRB1, the interface between the polysilicon layer 51p and the polysilicon layer 52p, and the crystal grain boundary GRB2, the moving path is extended longer than that of the crystal grain boundary GRB in FIG. 28A, and therefore, the electrons are difficult to pass through.

In the present embodiment, by stacking the thin polysilicon layer as the I layer between the n-type layer and the p-type layer of the diode, it is prevented that the crystal grain boundaries linearly penetrate through between the n-type layer and the p-type layer, and therefore, the generation of the OFF current in the application of the reverse-bias voltage can be prevented. In this manner, the generation of the leakage current can be prevented without increasing the height of the polysilicon diode. Therefore, in the polysilicon diode of the present embodiment, its aspect ratio is smaller than that of the polysilicon diode PDb illustrated as the comparison example in FIG. 28B, and therefore, the microfabrication can be further achieved.

That is, in the nonvolatile semiconductor memory device of the present embodiment, the generation of the leakage current can be prevented without increasing the height of the polysilicon diode, and therefore, the width of the polysilicon diode can be narrowed, and the microfabrication of the phase-change memory having the polysilicon diode as the selective element can be promoted.

Also, by the microfabrication of the polysilicon diode which is the selective element, the microfabrication of the memory formed on the polysilicon diode can be achieved. In this manner, the power consumption in the writing/erasing can be reduced, and the nonvolatile semiconductor memory device having the phase-change memory whose operation speed is improved can be provided.

Note that each of the p-type polysilicon layer 40p and the n-type polysilicon layer 60p illustrated in FIG. 1 is the layer made of polysilicon as well as the polysilicon layers 51p and 52p. However, the polysilicon layers 40p and 60p are the low-resistance layers formed as the conductive layers, and therefore, it is not required to provide the stacked structure of the plurality of stacked layers in order to prevent the generation of the leakage current. When at least one of the polysilicon layers 40p and 60p is formed by stacking a plurality of semiconductor layers, the manufacturing steps of the nonvolatile semiconductor memory device are complicated, and therefore, each of the polysilicon layers 40p and 60p is preferably formed of a single layer.

Second Embodiment

In the above-described first embodiment, the nonvolatile semiconductor memory device having the vertical-type chain memories as the phase-change memories has been described. In the present embodiment, a nonvolatile semiconductor memory device having cross-point type phase-change memories each having a phase-change material sandwiched by metal electrodes as the phase-change memories is described with reference to FIGS. 30 to 39.

Figure 30:
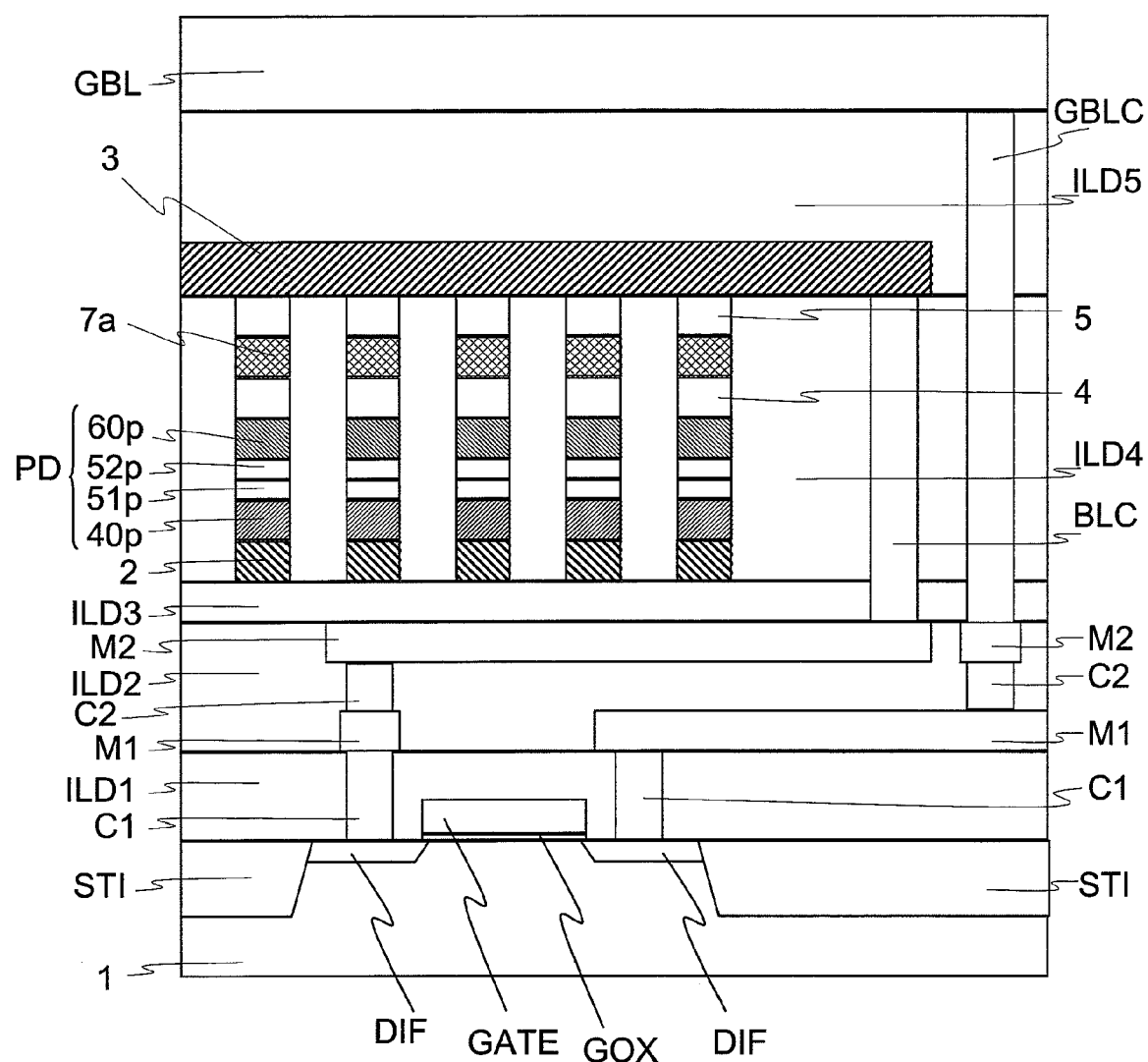
FIG. 30 is a cross-sectional view of a principal part of a memory matrix of a nonvolatile semiconductor memory device according to a second embodiment of the present invention.

First, FIG. 30 illustrates a cross-sectional view of a principal part of the nonvolatile semiconductor memory device of the present embodiment. Other structures except for that of the memory cell array are almost same as that of the phase-change memory of the first embodiment illustrated in FIG. 1. However, the present embodiment is different from the above-described first embodiment in a point that the phase-change memory on the polysilicon diode PD has a column-shaped structure including three layers of a metal electrode film 4, a phase-change material layer 7a, and a metal electrode film 5. Note that the polysilicon diode PD, the metal electrode films 4 and 5, and the phase-change material layer 7a are formed in a column shape penetrating through the interlayer insulating film ILD4, and are arranged in a matrix shape above the semiconductor substrate 1. The bit line 3 electrically connected to the metal electrode film 5 and the interlayer insulating film ILD5 formed so as to cover the bit line are provided above the interlayer insulating film ILD4, and the global bit line GBL is formed above the interlayer insulating film ILD5. Similarly to the above-described first embodiment with reference to FIG. 1, the wires such as the gate wires GL1 to GL4, STGL1, and STGL2 are not formed between the global bit line GBL and the bit line 3.

Figure 31:
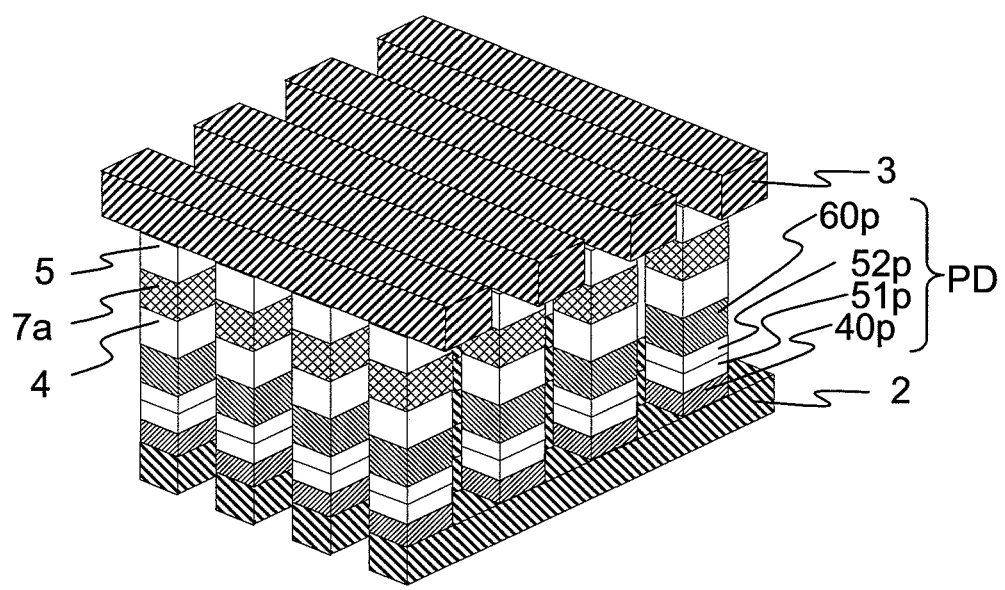
FIG. 31 is an overhead view of the memory matrix of the nonvolatile semiconductor memory device according to the second embodiment of the present invention.

FIG. 31 illustrates an overhead view of a part of the memory cell array between the word line 2 and the bit line 3, which includes the polysilicon diode PD and the phase-change memory of the present embodiment. As illustrated in FIG. 31, similarly to the above-described first embodiment, the memory cell array of the present embodiment has the plurality of word lines 2 arranged to extend in a stripe shape and the plurality of polysilicon diodes PD arranged above the word lines 2. The metal electrode film 4, the phase-change material layer 7a, and the metal electrode film 5 are sequentially formed above the polysilicon diode PD, and the bit line 3 extending in a stripe shape in a direction orthogonal to the word line 2 is formed above the metal electrode film 5. The word line 2 and the bit line 3 are formed so as to be planarly orthogonal to each other, a memory cell configured of the polysilicon diode PD and the phase-change memory is formed in a column shape on an intersection thereof, and each memory cell is arranged in a matrix shape.

Note that, in FIG. 31, the interlayer insulating film ILD4 burying the space between the polysilicon diodes PD, the space between the word lines 2, and the space between the bit lines 3 is not illustrated, and only the word line 2, the bit line 3, the polysilicon diode PD, the metal electrode films 4 and 5, and the phase-change material layer 7a are illustrated. Although not illustrated, each of the plurality of word lines 2 and bit lines 3 in FIG. 31 is connected to a circuit above the semiconductor substrate, and a voltage can be independently applied thereto.

Similarly to the above-described first embodiment, in the nonvolatile semiconductor memory device of the present embodiment, information is stored by using the different resistivity between the amorphous state and the crystalline state of the phase-change material such as $Ge_2Sb_2Te_5$ contained in the phase-change material layer 7a. The amorphous state has a high resistance and the crystalline state has a low resistance. Therefore, the reading of the information can be performed by applying a voltage differential to both ends of a resistance variable element including the phase-change material layer 7a, measuring a current flowing through the element, and distinguishing either the high-resistance state or the low-resistance state in the element.

Figure 32:
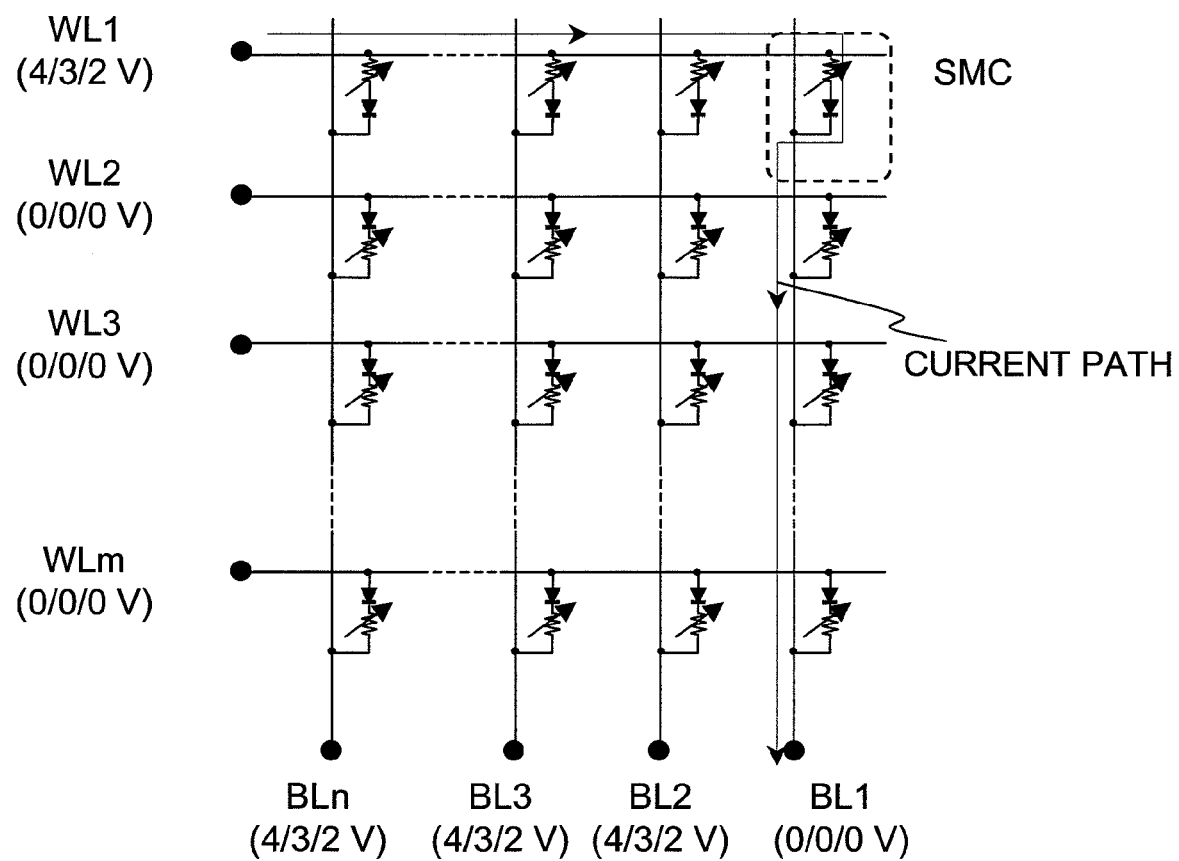
FIG. 32 is an equivalent circuit diagram of the memory matrix of the nonvolatile semiconductor memory device according to the second embodiment of the present invention.

Next, with reference to FIG. 32, operations of the nonvolatile semiconductor memory device of the present embodiment are described. FIG. 32 illustrates a potential relation among the bit lines BL1, BL2, BL3, and BLn, and the word lines WL1, WL2, WL3, and WLm when the reset (erasing) operation, the set (writing) operation, and the reading operation are performed. The potentials of the WL1 which are 4/3/2 V indicate potentials in the reset operation, the set operation, and the reading operation, respectively. The showing of the potentials of other terminals in FIG. 32 also indicates potentials in the reset operation, the set operation, and the reading operation, sequentially from a left side.

In a memory cell connected to the bit line BL2, BL3, or BLn and connected to the word line WL1, the potentials of the bit line and the word line are both 4 V in the reset operation, both 3 V in the set operation, and both 2 V in the reading operation, and therefore, the current is not flown therethrough because there is no potential difference therebetween. Also, in the memory cell connected to the bit line BL1 and the word line WL2, WL3, or WLm, the potentials of the bit line and the word line are both 0 V in the reset operation, the set operation, and the reading operation, and therefore, the current is not flown therethrough because there is no potential difference therebetween.

Here, in the memory cell connected to the bit line BL2, BL3, or BLn and the word line WL2, WL3, or WLm, the potentials of 0 V and 4 V are applied to the word line and the bit line in the reset operation, the potentials of 0 V and 3 V are applied to the word line and the bit line in the set operation, and the potentials of 0 V and 2 V are applied to the word line and the bit line in the reading operation, respectively. That is, a voltage is applied in a reverse bias direction to the polysilicon diode PD which selects the memory cell. The memory cell connected to the bit line BL2, BL3, or BLn and the word line WL2, WL3, or WLm is an unselected cell in which it is required to prevent the generation of the current by the polysilicon diode which is the selective element. At this time, a breakdown voltage of the polysilicon diode is determined by the leakage current through the crystal grain boundaries of the polysilicon layers 51p and 52p which are the electric-field relaxation layers illustrated in FIG. 31. In this case, it is required to set the breakdown voltage to be higher than 4 V.

In this manner, only in the memory cell (selected cell SMC) connected to the bit line BL1 and the word line WL1, a forward-bias voltage is applied to the polysilicon diode, and therefore, the current is flown therethrough. As a result, only the selected cell SMC in the memory cell array can be selected and operated.

Hereinafter, with reference to FIGS. 33 to 39, a manufacturing method of the nonvolatile semiconductor memory device of the present embodiment is described. Although not illustrated, first, a field-effect transistor is formed on a semiconductor substrate by an already-known method, and a wire electrically connected to the field-effect transistor is formed on an upper surface of an interlayer insulating film covering the field-effect transistor.

Figure 33:
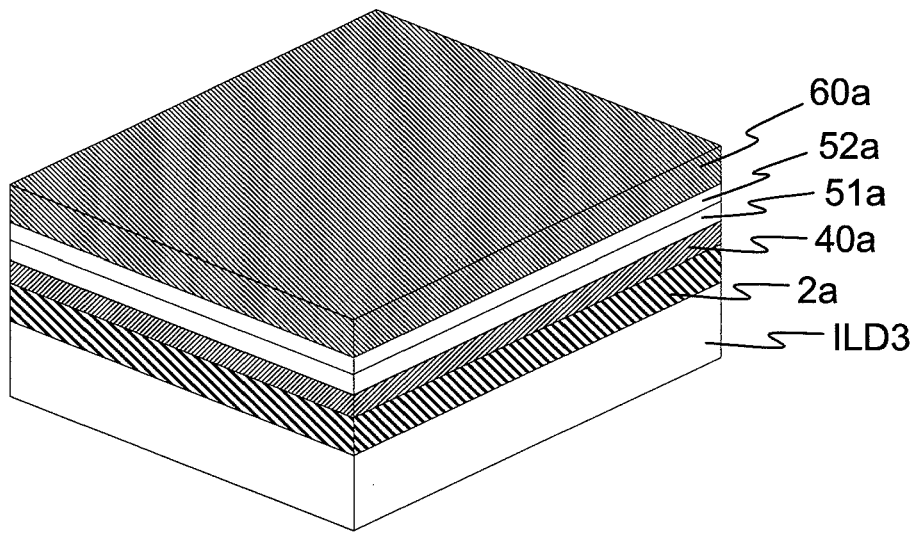
FIG. 33 is an overhead view illustrating a manufacturing method of the nonvolatile semiconductor memory device according to the second embodiment of the present invention.
Figure 34:
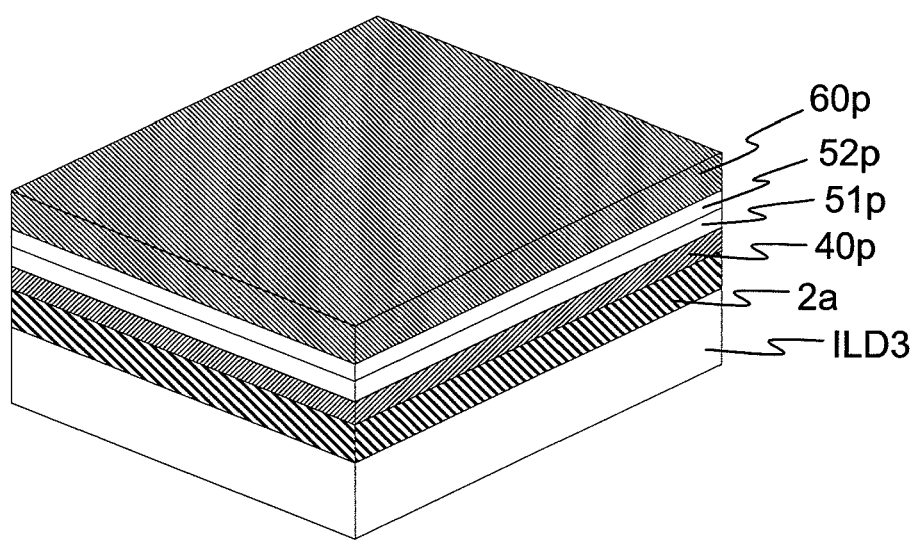
FIG. 34 is an overhead view explaining the manufacturing method of the nonvolatile semiconductor memory device, continued from FIG. 33.

Then, as illustrated in FIG. 33, on the interlayer insulating film, the interlayer insulating film ILD3, the tungsten film 2a, the amorphous silicon layer 40a to which the p-type impurity is doped, the amorphous silicon layers 51a and 52a to which any impurity is not doped, and the amorphous silicon layer 60a to which the n-type impurity is doped are sequentially formed by the CVD method.

Next, the crystallization of the amorphous silicon layers 40a, 51a, 52a, and 60a and the activation of the impurities contained in these amorphous silicon layers are performed by the thermal treatment. In this manner, the amorphous silicon layers 40a, 51a, 52a, and 60a illustrated in FIG. 33 are crystallized as illustrated in FIG. 3, and become the polysilicon layers 40p, 51p, 52p, and 60p, respectively. As the thermal treatment performed here, a method of using the RTA is also conceivable as described above in the first embodiment. However, it is preferable to use the laser annealing which allows the crystallization and the impurity activation as suppressing the impurity diffusion.

Figure 35:
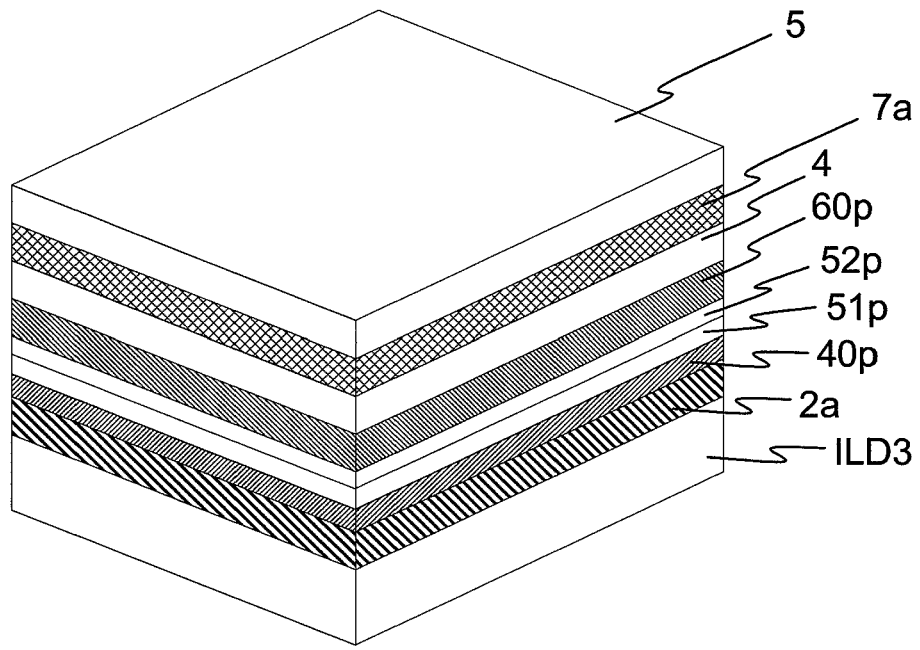
FIG. 35 is an overhead view explaining the manufacturing method of the nonvolatile semiconductor memory device, continued from FIG. 34.

Next, as illustrated in FIG. 35, the metal electrode film 4, the phase-change material layer 7a, and the metal electrode film 5 are sequentially formed above the polysilicon layer 60p. Each of the metal electrode films 4 and 5 is a film made of TiN (titanium nitride), and can be formed by, for example, a sputtering method. The phase-change material layer 7a is a layer made of a phase-change material such as $Ge_2Sb_2Te_5$, and can be formed by, for example, a CVD method.

Figure 36:
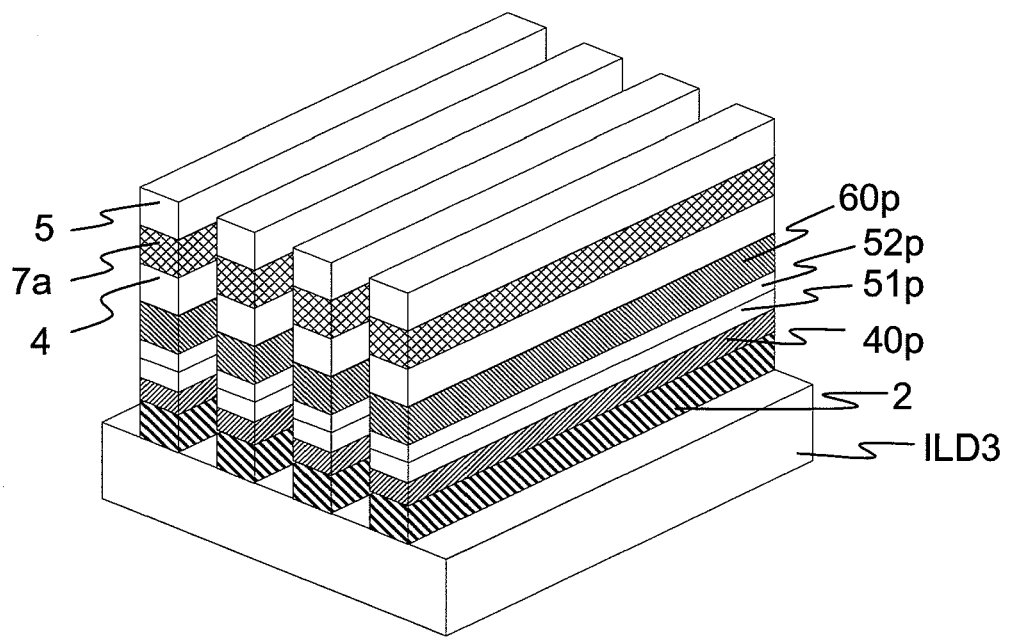
FIG. 36 is an overhead view explaining the manufacturing method of the nonvolatile semiconductor memory device, continued from FIG. 35.

Next, as illustrated in FIG. 36, the tungsten film 2a, the polysilicon layers 40p, 51p, 52p, and 60p, the metal electrode film 4, the phase-change material layer 7a, and the metal electrode film 5 are processed in a stripe-shaped pattern extending in the direction along the main surface of the semiconductor substrate (not illustrated) by a dry etching method with using a photolithography technique. In this manner, the word line 2 is formed of the tungsten film 2a. Here, the metal electrode film 5, the phase-change material layer 7a, the metal electrode film 4, the polysilicon layers 40p, 51p, 52p, and 60p and the word line 2 are collectively processed in the self alignment, and therefore, the stacking misalignment is not caused among the word line 2 and each layer above the word line 2 in the word-line direction, and thus, the reliability of the rewriting operation of the memory can be enhanced.

At this time, if a height of the layer including the polysilicon layers 51p and 52p is too high, with respect to a width of the stripe-shaped pattern including: the metal electrode film 5; the phase-change material layer 7a; the metal electrode film 4; the polysilicon layers 40p, 51p, 52p, and 60p; and the word line 2 in a direction orthogonal to the extending direction of the word line 2 and along the main surface of the semiconductor substrate (not illustrated), a height of the stripe-shaped pattern is too high. That is, the aspect ratio of the stripe-shaped pattern becomes high. If the aspect ratio is too high, the stripe-shaped pattern is easily collapsed, and therefore, it is required to widely form the width of the stripe-shaped pattern in order to prevent the pattern collapse, and thus, the microfabrication of the nonvolatile semiconductor memory device is prevented. Therefore, it is desirable to form the height of the layer including the polysilicon layers 51p and 52p as low as possible.

Figure 37:
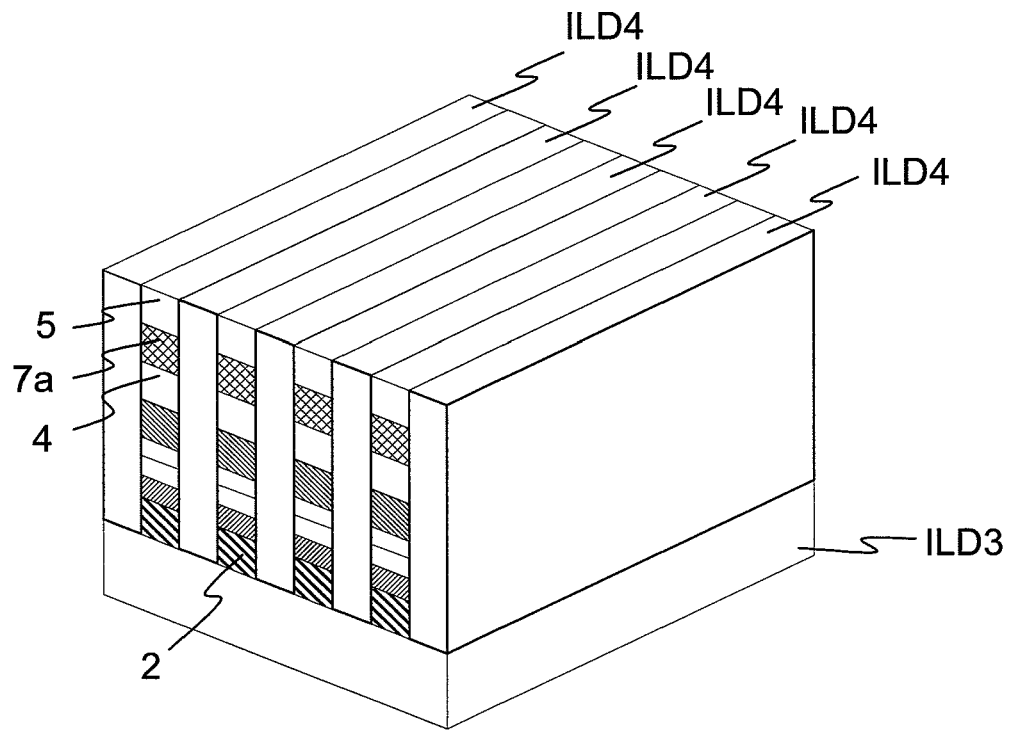
FIG. 37 is an overhead view explaining the manufacturing method of the nonvolatile semiconductor memory device, continued from FIG. 36.

Next, as illustrated in FIG. 37, the space between the word lines 2 arranged in the stripe shape and the space between the layers formed above the word line 2 are buried by the interlayer insulating film ILD4 formed by the CVD method, and then, the upper surface of the interlayer insulating film ILD4 is flattened by the CMP method to expose the upper surface of the metal electrode film 5.

Then, although the illustration is omitted, the contact plug BLC (see FIG. 30) connecting between the bit line 3 and the peripheral circuit formed above the semiconductor substrate is formed.

Figure 38:
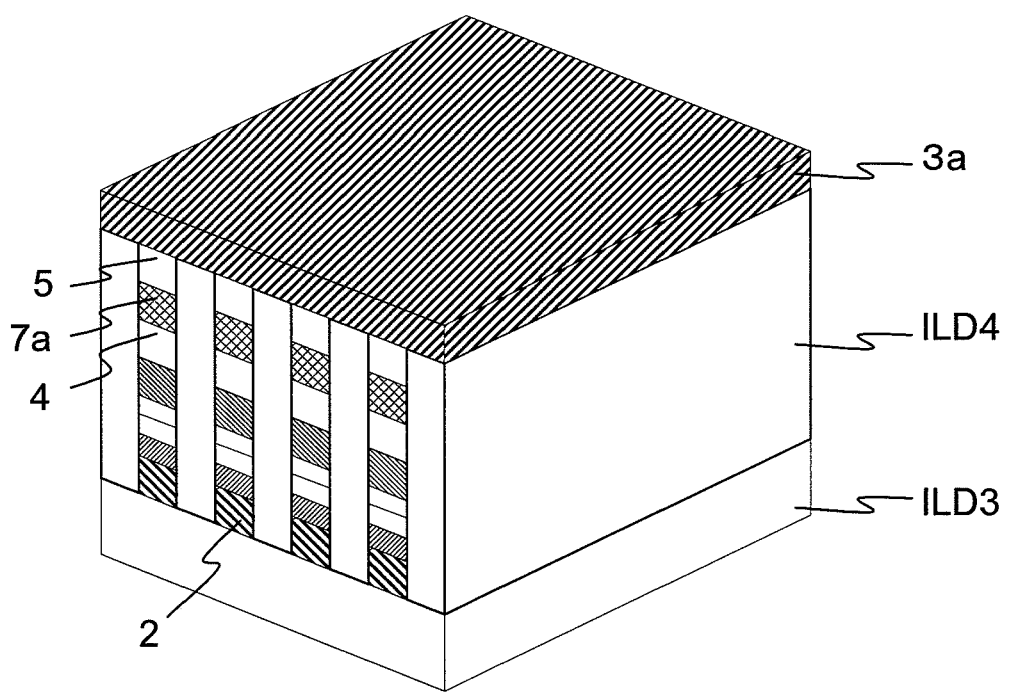
FIG. 38 is an overhead view explaining the manufacturing method of the nonvolatile semiconductor memory device, continued from FIG. 37.

Next, as illustrated in FIG. 38, the tungsten film 3a is formed by the sputtering method above the interlayer insulating film ILD4 and the metal electrode film 5.

Figure 39:
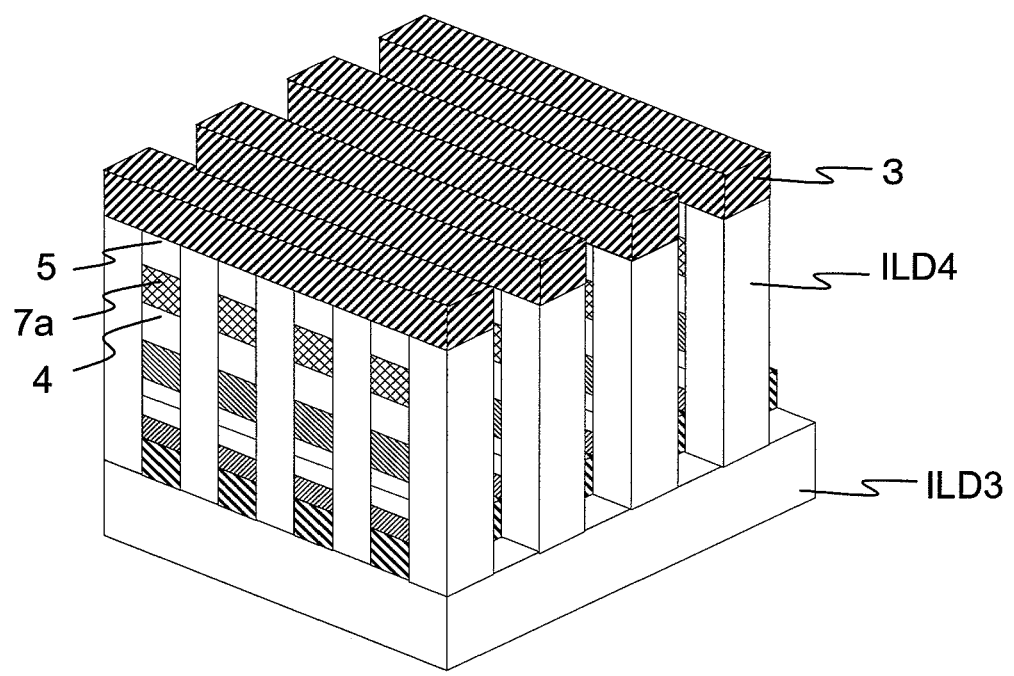
FIG. 39 is an overhead view explaining the manufacturing method of the nonvolatile semiconductor memory device, continued from FIG. 38.

Next, as illustrated in FIG. 39, by the dry etching method with using the photolithography technique, the tungsten film 3a, the interlayer insulating film ILD4, the metal electrode film 5, the phase-change material layer 7a, the metal electrode film 4, and the polysilicon layers 60p, 51p, 52p, and 40p are processed in the stripe shape extending in the direction along the main surface of the semiconductor substrate (not illustrated) and orthogonal to the extending direction of the word line 2. In this manner, a part of an upper surfaces and a side surface of the word line 2 is exposed, a part of an upper surface of the interlayer insulating film ILD3 is exposed, so that the bit line 3 is formed of the tungsten film 3a in a stripe shape. Here, a pillar (column) formed of: the metal electrode film 5; the phase-change material layer 7a; the metal electrode film 4; and the polysilicon diode PD is formed in self alignment with respect to both the word line 2 and the bit line 3. Therefore, the number of masks for the processing can be reduced, and therefore, the manufacturing cost can be reduced.

At this time, as described with reference to FIG. 36, if the aspect ratio of the stripe-shaped pattern is too high, the stripe-shaped pattern is readily collapsed. Therefore, in order to prevent the collapse of the stripe-shaped pattern including: the tungsten film 3a; the interlayer insulating film ILD4; the metal electrode film 5; the phase-change material layer 7a; the metal electrode film 4; and the polysilicon layers 60p, 51p, 52p, and 40p, which are formed in FIG. 39, it is desirable to form the height of the layer including the amorphous silicon layers 51p and 52p as low as possible.

While the illustration of subsequent steps is omitted, the space between the stripe-shaped patterns each formed in the etching step of FIG. 39 is buried by the interlayer insulating film ILD5 (see FIG. 30) formed by the CVD method, and then, a contact plug GBLC connecting between the global bit line GBL and the peripheral circuit in the lower layer is formed in the interlayer insulating film ILD5, and the global bit line GBL is formed above the interlayer insulating film ILD5, so that the nonvolatile semiconductor memory device illustrated in FIG. 30 is completed.

Note that, in the present embodiment, as a procedure of forming the polysilicon layers 51p and 52p which are the field-effect relaxation layers of the polysilicon diode PD illustrated in FIG. 30, the method of forming the amorphous silicon layers 51a and 52a (see FIG. 33) in the amorphous state, and then, changing the layers to the polysilicon layers 51p and 52p by the crystallization annealing is used. However, similarly to the above-described first embodiment, the polysilicon layers 51p and 52p can be formed in the polysilicon state from the beginning. Note that, in that case, there is the possibility that the upper surface and the side surface of the polysilicon layer have the concave and convex shape as described above. Also, it is described that the low-concentration impurity layer which is the field-effect relaxation layer is formed of two layers of the polysilicon layers 51p and 52p in the present embodiment. However, the field-effect relaxation layer is not limited as two layers, and may have a stacked structure including three or more layers.

Also, as described above, the RTA may be used for the annealing for changing the amorphous silicon to the polysilicon. However, it is preferable to use the laser annealing which allows the crystallization and the impurity activation as suppressing the impurity diffusion.

Further, by stacking the memory cell array illustrated in FIG. 31, a capacity of the nonvolatile semiconductor memory device can be increased.

In the nonvolatile semiconductor memory device of the present embodiment, similarly to the above-described first embodiment, by forming the electric-field relaxation layer forming the polysilicon diode by the plurality of polysilicon layers, the film thickness of the polysilicon diode can be reduced, and the generation of the leakage current in the polysilicon diode can be prevented. Therefore, compared with the case of forming the electric-field relaxation layer of the polysilicon diode which is the selective element of the phase-change memory by the single layer, the aspect ratio of the polysilicon diode can be reduced, and therefore, the microfabrication of the nonvolatile semiconductor memory device can be further achieved.

In the foregoing, the invention made by the inventors has been concretely described based on the embodiments. However, it is needless to say that the present invention is not limited to the foregoing embodiments and various modifications and alterations can be made within the scope of the present invention.

For example, the present invention can be applied not only to a phase-change memory but also to a memory having a diode as a selective element.

Also, in the above-described first and second embodiments, it is described that the wire below the diode is the word line and the wire above the phase-change memory is the bit line. However, the wire below the diode may be the bit line, and the wire above the phase-change memory may be the word line.

The manufacturing method of the nonvolatile semiconductor memory device of the present invention is widely used for a nonvolatile memory with using a diode as a selective element.

What is claimed is:

1. A nonvolatile semiconductor memory device comprising:
    a plurality of first wires formed above a semiconductor substrate and extending in a first direction of a main surface of the semiconductor substrate;
    a plurality of diodes formed above the respective plurality of first wires at a predetermined interval;
    a plurality of nonvolatile memories formed above the plurality of diodes and electrically connected to the plurality of diodes; and
    a plurality of second wires formed above the plurality of nonvolatile memories and extending in a second direction orthogonal to the first direction,
    each of the plurality of diodes functioning as a selective element of each of the plurality of nonvolatile memories,
    each of the plurality of diodes having a column-shaped stacked structure vertically stacked above the main surface of the semiconductor substrate, the stacked structure including:
        a first-conductivity type semiconductor layer having a first resistivity, formed above each of the plurality of first wires and electrically connected to the plurality of first wires;
        a plurality of polycrystalline semiconductor layers each having a second resistivity higher than the first resistivity, stacked above the first-conductivity type semiconductor layer; and
        a second-conductivity type semiconductor layer having a third resistivity lower than the second resistivity, formed above the plurality of polycrystalline semiconductor layers and electrically connected to the plurality of nonvolatile memories, and
    the plurality of first wires and the plurality of second wires configuring word lines and bit lines for selecting the plurality of nonvolatile memories.

2. The nonvolatile semiconductor memory device according to claim 1, wherein
    the first-conductivity type semiconductor layer and the second-conductivity type semiconductor layer are made of polycrystalline silicon, and
    each of the plurality of polycrystalline semiconductor layers contains at least one of silicon, germanium, silicon carbide, and silicon germanium.

3. The nonvolatile semiconductor memory device according to claim 1, wherein
    each of the first-conductivity type semiconductor layer and the second-conductivity type semiconductor layer is formed of a single layer.

4. The nonvolatile semiconductor memory device according to claim 1, wherein
    the plurality of first wires are formed in a stripe shape extending in the first direction above the main surface of the semiconductor substrate,
    a first insulating film is buried between the plurality of diodes,
    a plurality of second insulating films and a plurality of gate wires are alternately stacked above the first insulating film;
    the plurality of second insulating films and the plurality of gate wires have a plurality of trenches each reaching an upper surface of the plurality of diodes,
    on an inner wall of each of the plurality of trenches, a third insulating film, a channel semiconductor layer electrically connected to the second-conductivity type semiconductor layer on a bottom portion of each of the plurality of trenches, a fourth insulating film, a phase-change material layer, and a fifth insulating film are formed along the inner wall of each of the plurality of trenches sequentially from a side of the inner wall of each of the plurality of trenches,
    the plurality of second wires are electrically connected to the channel semiconductor layer, and
    each of the plurality of nonvolatile memories is formed of: each of the plurality of gate wires; the third insulating film; the channel semiconductor layer; and the phase-change material layer.

5. The nonvolatile semiconductor memory device according to claim 1, wherein
    the plurality of first wires are formed in a stripe shape extending in the first direction above the main surface of the semiconductor substrate,
    a first insulating film is buried between the plurality of diodes,
    the plurality of nonvolatile memories each having a stacked structure obtained by sequentially stacking a first metal electrode film, a phase-change material layer, and a second metal electrode film are arranged above the plurality of diodes,
    an interlayer insulating film is buried between the plurality of nonvolatile memories adjacent to each other, and
    the plurality of second wires are formed in a stripe shape above the second metal electrode film and the interlayer insulting film, and the second metal electrode film and the plurality of second wires are electrically connected to each other.

* * * * *